(12) United States Patent
Tanaka

(10) Patent No.: US 11,450,381 B2
(45) Date of Patent: Sep. 20, 2022

(54) MULTI-DECK MEMORY DEVICE INCLUDING BUFFER CIRCUITRY UNDER ARRAY

(71) Applicant: Micron Technology, Inc., Boise, ID (US)

(72) Inventor: Tomoharu Tanaka, Kanagawa (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/546,720

(22) Filed: Aug. 21, 2019

(65) Prior Publication Data

US 2021/0057020 A1    Feb. 25, 2021

(51) Int. Cl.
| | |
|---|---|
| G11C 5/02 | (2006.01) |
| G11C 11/4096 | (2006.01) |
| G11C 16/16 | (2006.01) |
| G06F 13/16 | (2006.01) |
| G11C 11/4094 | (2006.01) |

(52) U.S. Cl.
CPC ...... *G11C 11/4096* (2013.01); *G06F 13/1673* (2013.01); *G11C 5/025* (2013.01); *G11C 11/4094* (2013.01); *G11C 16/16* (2013.01)

(58) Field of Classification Search
CPC . G11C 11/4096; G11C 5/025; G11C 11/4094; G11C 16/16; G06F 13/1673
See application file for complete search history.

(56) References Cited

U.S. PATENT DOCUMENTS

| | | |
|---|---|---|
| 3,825,907 A | 7/1974 | Sell et al. |
| 4,811,082 A | 3/1989 | Jacobs et al. |
| (Continued) | | |

FOREIGN PATENT DOCUMENTS

| | | |
|---|---|---|
| CN | 101853858 A | 10/2010 |
| CN | 103620781 A | 3/2014 |
| (Continued) | | |

OTHER PUBLICATIONS

"Chinese Application Serial No. 201280028890.6, Office Action dated Apr. 21, 2016", W/ English Translation, 12 pgs.

(Continued)

*Primary Examiner* — Khamdan N. Alrobaie
(74) *Attorney, Agent, or Firm* — Schwegman Lundberg & Woessner, P.A.

(57) ABSTRACT

Some embodiments include apparatuses and methods of using the apparatuses. One of the apparatuses includes a substrate, a first deck including first memory cell strings located over the substrate, a second deck including second memory cell strings and located over the first deck, first data lines located between the first and second decks and coupled to the first memory cell strings, second data lines located over the second deck and coupled to the second memory cell strings, and first and second circuitries. The first and second data lines extending in a direction from a first portion of the substrate to a second portion of the substrate. The first buffer circuitry is located in the first portion of the substrate under the first memory cell strings of the first deck and coupled to the first data lines. The second buffer circuitry is located in the second portion of the substrate under the first memory cell strings of the first deck and coupled to the second data lines.

15 Claims, 7 Drawing Sheets

(56) References Cited

U.S. PATENT DOCUMENTS

| | | |
|---|---|---|
| 5,680,347 A | 10/1997 | Takeuchi et al. |
| 5,732,018 A | 3/1998 | Choi et al. |
| 5,805,498 A | 9/1998 | Lee et al. |
| 5,818,756 A | 10/1998 | Sakui et al. |
| 5,859,802 A | 1/1999 | Lee et al. |
| 6,344,814 B1 | 2/2002 | Lin et al. |
| 6,621,735 B2 | 9/2003 | Nakamura et al. |
| 7,554,832 B2 | 6/2009 | Fasoli et al. |
| 7,852,676 B2 | 12/2010 | Maejima |
| 7,859,902 B2 | 12/2010 | Maejima |
| 7,920,408 B2 | 4/2011 | Azuma et al. |
| 8,098,520 B2 | 1/2012 | Seigler |
| 8,576,629 B2 | 11/2013 | Choe et al. |
| 8,619,471 B2 | 12/2013 | Tanzawa |
| 8,681,555 B2 | 3/2014 | Liu |
| 8,709,894 B2 | 4/2014 | Lee et al. |
| 8,837,222 B2 | 9/2014 | Tanzawa |
| 8,860,117 B2 | 10/2014 | Tanzawa |
| 8,964,474 B2 | 2/2015 | Morooka et al. |
| 8,984,214 B2 | 3/2015 | Chen et al. |
| 9,076,528 B2 | 7/2015 | Porterfield |
| 9,128,637 B2 | 9/2015 | Manning |
| 9,147,493 B2 | 9/2015 | Sakui |
| 9,152,512 B2 | 10/2015 | Cronin et al. |
| 9,165,653 B2 | 10/2015 | Asnaashari et al. |
| 9,170,898 B2 | 10/2015 | Porterfield |
| 9,362,300 B2 | 6/2016 | Lu et al. |
| 9,437,610 B2 | 9/2016 | Maejima |
| 9,543,003 B2 | 1/2017 | Lee et al. |
| 9,679,650 B1 | 6/2017 | Sakui |
| 9,704,876 B2 | 7/2017 | Tanzawa |
| 9,853,046 B2 | 12/2017 | Lu et al. |
| 10,074,430 B2 | 9/2018 | Sakui |
| 10,074,431 B2 | 9/2018 | Sakui |
| 10,269,429 B2 | 4/2019 | Morooka et al. |
| 10,354,730 B2 | 7/2019 | Sakui |
| 10,510,414 B2 | 12/2019 | Sakui et al. |
| 10,580,790 B2 | 3/2020 | Tanzawa |
| 10,803,944 B2 | 10/2020 | Morooka et al. |
| 10,978,155 B2 | 4/2021 | Sakui |
| 11,145,673 B2 | 10/2021 | Tanzawa |
| 2003/0147269 A1 | 8/2003 | Nishihara |
| 2004/0073745 A1 | 4/2004 | Ma et al. |
| 2005/0226049 A1 | 10/2005 | Jeong et al. |
| 2006/0126397 A1 | 6/2006 | Tanishima |
| 2006/0146608 A1 | 7/2006 | Fasoli et al. |
| 2006/0203547 A1 | 9/2006 | Takeuchi |
| 2006/0245249 A1 | 11/2006 | Hwang |
| 2007/0030737 A1 | 2/2007 | Aritome |
| 2007/0161162 A1 | 7/2007 | Jeng |
| 2007/0252201 A1 | 11/2007 | Kito et al. |
| 2008/0099819 A1 | 5/2008 | Kito et al. |
| 2008/0180994 A1 | 7/2008 | Katsumata et al. |
| 2008/0258129 A1 | 10/2008 | Toda |
| 2008/0303083 A1 | 12/2008 | Oyu |
| 2009/0161474 A1 | 6/2009 | Scheuerlein et al. |
| 2009/0168534 A1 | 7/2009 | Park et al. |
| 2009/0224330 A1 | 9/2009 | Hong et al. |
| 2009/0244968 A1 | 10/2009 | Maejima |
| 2009/0267139 A1 | 10/2009 | Maejima |
| 2009/0268522 A1 | 10/2009 | Maejima |
| 2009/0268524 A1 | 10/2009 | Maejima |
| 2010/0002516 A1 | 1/2010 | Sim et al. |
| 2010/0067300 A1 | 3/2010 | Nakamura |
| 2010/0109071 A1 | 5/2010 | Tanaka et al. |
| 2010/0177566 A1 | 7/2010 | Kim et al. |
| 2010/0181612 A1 | 7/2010 | Kito et al. |
| 2010/0207185 A1 | 8/2010 | Lee et al. |
| 2010/0207186 A1 | 8/2010 | Higashi et al. |
| 2010/0214838 A1 | 8/2010 | Hishida et al. |
| 2010/0226195 A1 | 9/2010 | Lue |
| 2010/0232207 A1 | 9/2010 | Maejima et al. |
| 2010/0238732 A1 | 9/2010 | Hishida et al. |
| 2010/0270529 A1 | 10/2010 | Lung |
| 2010/0270593 A1 | 10/2010 | Lung et al. |
| 2010/0314678 A1 | 12/2010 | Lim et al. |
| 2010/0315881 A1 | 12/2010 | Kim et al. |
| 2010/0320526 A1 | 12/2010 | Kidoh et al. |
| 2010/0320528 A1 | 12/2010 | Jeong et al. |
| 2010/0321981 A1 | 12/2010 | Jeon et al. |
| 2010/0321984 A1 | 12/2010 | Rahim et al. |
| 2010/0321998 A1 | 12/2010 | Jang |
| 2010/0322000 A1 | 12/2010 | Shim et al. |
| 2010/0327339 A1 | 12/2010 | Tanaka et al. |
| 2011/0013454 A1 | 1/2011 | Hishida et al. |
| 2011/0049611 A1 | 3/2011 | Kiyotoshi et al. |
| 2011/0063916 A1 | 3/2011 | Maeda |
| 2011/0169071 A1 | 7/2011 | Uenaka et al. |
| 2011/0182105 A1 | 7/2011 | Yan et al. |
| 2011/0216603 A1 | 9/2011 | Han et al. |
| 2011/0228586 A1 | 9/2011 | Kawabata et al. |
| 2011/0249503 A1 | 10/2011 | Yamada et al. |
| 2011/0286283 A1 | 11/2011 | Lung et al. |
| 2012/0063194 A1 | 3/2012 | Baek et al. |
| 2012/0075934 A1 | 3/2012 | Louie et al. |
| 2012/0013421 A1 | 5/2012 | Maeda |
| 2012/0182804 A1 | 7/2012 | Hung et al. |
| 2012/0273862 A1 | 11/2012 | Tanzawa |
| 2013/0051145 A1 | 2/2013 | Ahn |
| 2013/0051146 A1 | 2/2013 | Yun et al. |
| 2013/0235673 A1 | 9/2013 | Kwak |
| 2013/0258745 A1 | 10/2013 | Tanzawa |
| 2013/0258785 A1 | 10/2013 | Sakui |
| 2013/0272067 A1 | 10/2013 | Lee et al. |
| 2013/0277731 A1 | 10/2013 | Goda et al. |
| 2013/0336065 A1* | 12/2013 | Morooka ............... G11C 16/06 365/185.17 |
| 2014/0036590 A1 | 2/2014 | Feeley et al. |
| 2014/0056049 A1 | 2/2014 | Tanzawa |
| 2014/0061747 A1 | 3/2014 | Tanzawa et al. |
| 2014/0063936 A1 | 3/2014 | Shim et al. |
| 2014/0063959 A1 | 3/2014 | Tanzawa |
| 2014/0104918 A1* | 4/2014 | Castro ................. H01L 27/2436 365/63 |
| 2014/0104948 A1 | 4/2014 | Rhie |
| 2014/0112074 A1 | 4/2014 | Rhie |
| 2014/0119117 A1 | 5/2014 | Sakui et al. |
| 2014/0189257 A1 | 7/2014 | Aritome |
| 2014/0189258 A1 | 7/2014 | Aritome |
| 2014/0192584 A1 | 7/2014 | Aritome |
| 2014/0192594 A1 | 7/2014 | Lue |
| 2014/0219025 A1 | 8/2014 | Kang |
| 2014/0313839 A1 | 10/2014 | Sakui et al. |
| 2014/0362650 A1 | 12/2014 | Castro |
| 2014/0369116 A1 | 12/2014 | Sakui |
| 2015/0003150 A1 | 1/2015 | Aritome |
| 2015/0003157 A1 | 1/2015 | Aritome |
| 2015/0003158 A1 | 1/2015 | Aritome |
| 2015/0021609 A1 | 1/2015 | Tanzawa |
| 2015/0070994 A1 | 3/2015 | Hosono et al. |
| 2015/0162084 A1 | 6/2015 | Morooka et al. |
| 2015/0228349 A1 | 8/2015 | Park et al. |
| 2015/0255161 A1 | 9/2015 | Lee et al. |
| 2015/0262682 A1 | 9/2015 | Futatsuyama et al. |
| 2015/0279855 A1 | 10/2015 | Lu et al. |
| 2015/0294722 A1 | 10/2015 | Fukano |
| 2015/0340096 A1 | 11/2015 | Shim et al. |
| 2015/0357344 A1 | 12/2015 | Tanzawa |
| 2015/0380097 A1 | 12/2015 | Sato et al. |
| 2016/0049201 A1 | 2/2016 | Lue et al. |
| 2016/0064088 A1 | 3/2016 | Shiga et al. |
| 2016/0086669 A1 | 3/2016 | Kim et al. |
| 2016/0104717 A1 | 4/2016 | Lu et al. |
| 2016/0111161 A1 | 4/2016 | Louie et al. |
| 2016/0118123 A1 | 4/2016 | Jung et al. |
| 2016/0148703 A1 | 5/2016 | Kim et al. |
| 2016/0163390 A1 | 6/2016 | Park |
| 2016/0172041 A1 | 6/2016 | Sakui |
| 2016/0180934 A1 | 6/2016 | Sakui et al. |
| 2016/0284728 A1 | 9/2016 | Lu et al. |
| 2017/0110198 A1 | 4/2017 | Zhao et al. |
| 2017/0309641 A1 | 10/2017 | Tanzawa |
| 2017/0330626 A1 | 11/2017 | Sakui |
| 2018/0012634 A1 | 1/2018 | Sakui |

(56) References Cited

U.S. PATENT DOCUMENTS

| | | | |
|---|---|---|---|
| 2018/0040377 A1* | 2/2018 | Sakui | G11C 5/063 |
| 2018/0197949 A1* | 7/2018 | Ramaswamy | H01L 27/0805 |
| 2018/0358096 A1 | 12/2018 | Sakui | |
| 2018/0366198 A1* | 12/2018 | Sakui | G11C 16/08 |
| 2019/0362792 A1* | 11/2019 | Oh | H01L 27/11565 |
| 2020/0005869 A1 | 1/2020 | Morooka et al. | |
| 2020/0013465 A1 | 1/2020 | Sakui | |
| 2020/0160913 A1 | 5/2020 | Sakui | |
| 2020/0203377 A1 | 6/2020 | Tanzawa | |
| 2021/0098065 A1 | 4/2021 | Morooka et al. | |
| 2022/0028891 A1 | 1/2022 | Tanzawa | |

FOREIGN PATENT DOCUMENTS

| | | |
|---|---|---|
| CN | 104050998 A | 9/2014 |
| CN | 104823242 A | 8/2015 |
| CN | 105810249 A | 7/2016 |
| CN | 201280028890.6 | 2/2017 |
| CN | 108140416 A | 6/2018 |
| CN | 106935255 B | 4/2020 |
| CN | 112420715 A | 2/2021 |
| EP | 2702610 B1 | 9/2016 |
| JP | 2001298194 A | 10/2001 |
| JP | 2009212280 A | 9/2009 |
| JP | 2010114113 A | 5/2010 |
| JP | 2010165794 A | 7/2010 |
| JP | 2010166055 A | 7/2010 |
| JP | 2010187001 A | 8/2010 |
| KR | 20060100993 A | 9/2006 |
| KR | 20100003629 A | 1/2010 |
| KR | 1020100003629 A | 1/2010 |
| KR | 20100095721 A | 9/2010 |
| KR | 20130097562 A | 9/2013 |
| KR | 20160047661 A | 5/2016 |
| KR | 10-1865169 | 5/2018 |
| KR | 102080572 B1 | 2/2020 |
| KR | 102271636 B1 | 7/2021 |
| TW | 381267 B | 2/2000 |
| TW | 200710851 A | 3/2007 |
| TW | 201308577 A | 2/2013 |
| TW | 201407630 A | 2/2013 |
| TW | I524356 B | 3/2016 |
| TW | 201612899 A | 4/2016 |
| TW | 201905907 A | 2/2019 |
| WO | WO-2012149424 A2 | 11/2012 |
| WO | WO-2012149424 A3 | 11/2012 |
| WO | WO-2013188399 A1 | 12/2013 |
| WO | WO-2014059519 A1 | 4/2014 |
| WO | WO-2014063225 A1 | 5/2014 |
| WO | WO-2018031474 A1 | 2/2018 |

OTHER PUBLICATIONS

"Chinese Application Serial No. 201280028890.6, Office Action dated Oct. 12, 2015", W/ English Translation, 8 pgs.

"Chinese Application Serial No. 201280028890.6, Response filed Jan. 4, 2016 to Office Action dated Oct. 12, 2015", W/ English Claims, 26 pgs.

"Chinese Application Serial No. 201280028890.6, Response filed Jul. 5, 2016 to Office Action dated Apr. 21, 2016", W/ English Claims, 27 pgs.

"Chinese Application Serial No. 201710001454.4, Office Action dated May 23, 2019", w/English Translation, 22 pgs.

"Chinese Application Serial No. 201710001454.4, Office Action dated Jul. 30, 2018", W/ English Translation, 12 pgs.

"Chinese Application Serial No. 201710001454.4, Response Filed Feb. 14, 2019 to Office Action dated Jul. 30, 2018", w/English Claims, 18 pgs.

"European Application Serial No. 12776549.3 Response filed Mar. 10, 2015 to Extended European Search Report dated Mar. 10, 2015", 18 pgs.

"European Application Serial No. 12776549.3, Communication under Rule 71(3) dated Mar. 31, 2016", 59 pgs.

"European Application Serial No. 12776549.3, Extended European Search Report dated Oct. 14, 2014", 6 pgs.

"European Application Serial No. 12776549.3, Preliminary Amendment filed Jun. 11, 2014", 9 pgs.

"International Application Serial No. PCT/US2012/035596, International Preliminary Report on Patentability dated Nov. 7, 2013", 8 pgs.

"International Application Serial No. PCT/US2012/035596, International Search Report dated Jan. 10, 2013", 5 pgs.

"International Application Serial No. PCT/US2012/035596, Invitation to Pay Additional Fees and Partial Search Report dated Nov. 26, 2012", 7 pgs.

"International Application Serial No. PCT/US2012/035596, Written Opinion dated Jan. 10, 2013", 6 pgs.

"International Application Serial No. PCT/US2013/045173, International Preliminary Report on Patentability dated Dec. 24, 2014", 8 pgs.

"International Application Serial No. PCT/US2013/045173, International Search Report dated Sep. 26, 2013", 3 pgs.

"International Application Serial No. PCT/US2013/045173, Written Opinion dated Sep. 26, 2013", 6 pgs.

"International Application Serial No. PCT/US2017/045762, International Preliminary Report on Patentability dated Feb. 21, 2019", 9 pgs.

"International Application Serial No. PCT/US2017/045762, International Search Report dated Nov. 10, 2017", 3 pgs.

"International Application Serial No. PCT/US2017/045762, Written Opinion dated Nov. 10, 2017", 7 pgs.

"Janpanese Application Serial No. 2014-508138, Non Final Office Action dated Oct. 13, 2015", W/ English Translation, 10 pgs.

"Janpanese Application Serial No. 2014-508138, Response Filed Jan. 7, 2016 to Non Final Office Action dated Oct. 13, 2015", w/English Translation, 7 pgs.

"Japanese Application Serial No. 2014-508138, Office Action dated May 19, 2015", w/English Translation, 9 pgs.

"Japanese Application Serial No. 2014-508138, Response filed Aug. 10, 2015 to Office Action dated May 19, 2015", W/ English Claims, 14 pgs.

"Korean Application Serial No. 10-2013-7031681, Office Action dated Jun. 29, 2017", W/ English Translation, 34 pgs.

"Korean Application Serial No. 10-2013-7031681, Response filed Nov. 28, 2017 for Office Action dated Jun. 29, 2017", w/English Claims, 31 pgs.

"Korean Application Serial No. 10-2018-7015490, Notice of Preliminary Rejection dated Feb. 27, 2019", w/English Translation, 20 pgs.

"Korean Application Serial No. 10-2018-7015490, Response filed May 23, 2019 to Notice of Preliminary Rejection dated Feb. 27, 2019", w/ English Claims, 17 pgs.

"Taiwanese Application Serial No. 101115256, Amendment filed Apr. 9, 2015", w/English Claims.

"Taiwanese Application Serial No. 101115256, Decision of Rejection dated May 9, 2016", W/ English Translation, 6 pgs.

"Taiwanese Application Serial No. 101115256, Office Action dated Sep. 14, 2015", W/ English Translation, 7 pgs.

"Taiwanese Application Serial No. 101115256, Response filed Mar. 15, 2016 to Office Action dated Sep. 14, 2015", w/English Claims, 38 pgs.

"Taiwanese Application Serial No. 102121223, Office Action dated Aug. 13, 2015", W/ English Translation, 3 pgs.

"Taiwanese Application Serial No. 102121223, Response filed Nov. 12, 2015 to Office Action dated Aug. 13, 2015", W/ English Claims, 14 pgs.

"Taiwanese Application Serial No. 102121223, Supplemental Voluntary Amendment filed Jul. 2, 2015", W/ English Claims, 7 pgs.

"Taiwanese Application Serial No. 102121223, Voluntary Amendment filed Apr. 3, 2014", W/ English Claims, 36 pgs.

"Taiwanese Application Serial No. 1041143893, Response filed May 22, 2017 to Office Action dated Feb. 18, 2017", w/English Translation, 36 pgs.

"Taiwanese Application Serial No. 104143893, Office Action dated Feb. 18, 2017", w/English Translation, 13 pgs.

(56) References Cited

OTHER PUBLICATIONS

"Taiwanese Application Serial No. 104143893, Office Action dated May 7, 2018", w/English Translation, 19 pgs.
"Taiwanese Application Serial No. 104143893, Office Action dated Oct. 18, 2017", w/English Translation, 8 pgs.
"Taiwanese Application Serial No. 104143893, Response filed Jan. 19, 2018 to Office Action dated Oct. 18, 2017", w/English Claims, 37 pgs.
"Taiwanese Application Serial No. 104143893, Response filed Aug. 9, 2018 to Office Action dated May 7, 2018", w/ English Claims, 36 pgs.
"Taiwanese Application Serial No. 107136222, First Office Action dated Apr. 12, 2019", w/ English translation, 14 pgs.
"Taiwanese Application Serial No. 107136222, Response filed Jul. 12, 2019 to First Office Action dated Apr. 12, 2019", w/ English Claims, 36 pgs.
Chiang, M H, et al., "Novel High-Density Low-Power Logic Circuit Techniques Using DG Devices", IEEE ED, 52(10), (2005), 2339-42.
Crowley, Matthew, et al., "512 Mb PROM with 8 layers of antifuse/diode cells", 2003 IEEE International Solid-State Circuits Conference, 2003. Digest of Technical Papers. ISSCC, (2003), 284-293.
Jang, J., et al., "Vertical cell array using TCAT(Terabit Cell Array Transistor) technology for ultra high density NAND flash memory", Symposium on VLSI Technology, (2009), 192-193.
Johnson, Mark, et al., "512-Mb PROM with a three-dimensional array of diode/antifuse memory cells", IEEE Journal of Solid-State Circuits, 38(11), (2003), 1920-1928.
Katsumata, R., et al., "Pipe-shaped BiCS flash memory with 16 stacked layers and multi-level-cell operation for ultra high density storage devices", Symposium on VLSI Technology, (Jun. 2009), 136-37.
Kim, J., et al., "Novel Vertical-Stacked Array-Transistor (VSAT) for ultra-high-density and cost-effective NAND Flash memory devices and SSD (Solid State Drive)", Symposium on VLSI Technology, (2009), 186-187.
Kim, W., et al., "Multi-layered Vertical Gate NAND Flash overcoming stacking limit for terabit density storage", Symposium on VLSI Technology, (2009), 188-89.
Park, Ki-Tae, et al., "A 7MB/s 64Gb 3-Bit/Cell DDR NAND Flash Memory in 20nm-Node Technology", ISSCC 2011 / SESSION 11 / Non-Volatile Memory Solutions /11.8, 2011 IEEE International Solid-State Circuits Conference (Digest of Technical Papers), (Feb. 22, 2011), 212-213.
Sakui, K, et al., "Design Impacts on NAND Flash Memory Core Circuits with Vertical MOSFETs", IEEE International Memory Workshop (IMW), (May 2010), 1-4.
Tanaka, H., et al., "Bit Cost Scalable Technology with Punch and Plug Process for Ultra High Density Flash Memory", IEEE Symposium on VLSI Technology, (2007), 14-15.
U.S. Appl. No. 13/096,822 U.S. Pat. No. 8,860,117, filed Apr. 28, 2011, Semiconductor Apparatus With Multiple Tiers of Memory Cells With Peripheral Transistors, and Methods.
U.S. Appl. No. 14/511,340 U.S. Pat. No. 9,704,876, filed Oct. 10, 2014, Semiconductor Apparatus With Multiple Tiers, and Methods.
U.S. Appl. No. 15/645,635, filed Jul. 10, 2017, Semiconductor Apparatus With Multiple Tiers, and Methods.
U.S. Appl. No. 13/524,872 U.S. Pat. No. 8,964,474, filed Jun. 15, 2012, Architecture for 3-D NAND Memory.
U.S. Appl. No. 14/626,540 U.S. Pat. No. 10,269,429, filed Feb. 19, 2015, Architecture for 3-D NAND Memory.
U.S. Appl. No. 16/378,900, filed Apr. 8, 2019, Architecture for 3-D NAND Memory.
U.S. Appl. No. 15/148,408 U.S. Pat. No. 9,679,650, filed May 6, 2016, 3D NAND Memory Z-Decoder.
U.S. Appl. No. 15/606,493 U.S. Pat. No. 10,074,431, filed May 26, 2017, 3D NAND Memory Z-Decoder.
U.S. Appl. No. 16/107,357, filed Aug. 21, 2018, 3D NAND Memory Z-Decoder.
U.S. Appl. No. 15/231,011, U.S. Pat. No. 10,074,430, filed Aug. 8, 2016, Multi-Deck Memory Device With Access Line and Data Line Segregation Between Decks and Method of Operation Thereof.
U.S. Appl. No. 16/108,766 U.S. Pat. No. 10,354,730, filed Aug. 22, 2018, Multi-Deck Memory Device With Access Line and Data Line Segregation Between Decks and Method of Operation Thereof.
U.S. Appl. No. 16/512,067, filed Jul. 15, 2019, Multi-Deck Memory Device With Access Line and Data Line Segregation Between Decks and Method of Operation Thereof.
"European Application Serial No. 17746364.3, Partial Supplementary European Search Report dated Mar. 4, 2020", 14 pgs.
"Korean Application Serial No. 10-2019-7006921, Office Action dated Mar. 31, 2020", w/ English translation, 10 pgs.
U.S. Appl. No. 16/806,755, filed Mar. 2, 2020, Semiconductor Apparatus With Multiple Tiers, and Methods.
"Chinese Application Serial No. 17746364,3, Response to Communication pursuant to Rules 161(2) and 162 EPC filed Sep. 25, 2019", w/English Claims, 138 pgs.
"Chinese Application Serial No. 201710001454.4, Office Action dated Sep. 27, 2019", w/ English Translation, 39 pgs.
"Korean Application Serial No. 10-2018-7015490, Korean Final Office Action dated Sep. 23, 2019", W/English Translation, 7 pgs.
"Korean Application Serial No. 10-2018-7015490, Response filed Oct. 24, 2019 to Korean Final Office Action dated Sep. 23, 2019", w/ English Claims, 20 pgs.
"Korean Application Serial No. 10-2019-7006921, Office Action dated Nov. 19, 2020", w/English translation, 4 pgs.
"European Application Serial No. 17746364.3, European Search Report dated Jul. 8, 2020", 13 pgs.
"Japanese Application Serial No. 2019-507168, Notification of Reasons for Rejection dated Jun. 9, 2020", W/English Translation, 20 pgs.
"Korean Application Serial No. 10-2019-7006921, Response filed Jun. 4, 2020 to the Office Action dated Mar. 31, 2020", w/ English Claims, 28 pgs.
"Chinese Application Serial No. 201780000921.X, Office Action dated Dec. 18, 2020", w/o English translation, 12 pgs.
"Korean Application Serial No. 10-2019-7006921, Response filed Mar. 5, 2021 to Office Action dated Nov. 19, 2020", w/ English Claims, 11 pgs.
"Chinese Application Serial No. 201780000921.X, Office Action dated Oct. 11, 2021", w/o English translation, 14 pgs.
U.S. Appl. No. 17/498,503, filed Oct. 11, 2021, Semiconductor Apparatus With Multiple Tiers, and Methods.
"Chinese Application Serial No. 201780000921.X, Response Filed Dec. 13, 2021 to Office Action dated Oct. 11, 2021", W/English Claims, 49 pgs.
"Chinese Application Serial No. 201710001454.4, Response filed Dec. 4, 2019 to Office Action dated Sep. 27, 2019", w/ English Claims, 95 pgs.
"Japanese Application Serial No. 2019-507168, Voluntary Amendment Filed Jan. 20, 2020", w/Concise Statement of Relevance, 14 pgs.

* cited by examiner

MULTI-DECK MEMORY DEVICE INCLUDING BUFFER CIRCUITRY UNDER ARRAY

TECHNICAL FIELD

Embodiments described herein generally include memory devices, and more specifically relate to memory device having multiple decks of memory cells.

BACKGROUND

Memory devices are widely used in computers and many electronic items to store information. A memory device has numerous memory cells. The memory device performs a write operation to store information in the memory cells, a read operation to read the stored information, and an erase operation to erase information (e.g., obsolete information) from some or Al of the memory cells of the memory device. Memory cells in a memory device are usually organized in blocks. A memory device has access lines to access the blocks during a memory operation (e.g., read, write, or erase operation) and data lines to carry information e.g., in the form of signals) to be stored in or read from the blocks. The memory device also has driver circuits to provide signals to circuit elements of the blocks and buffer circuitry to hold information received from or to be stored in memory cells of the blocks. In some conventional memory devices, the blocks are formed in a single deck. Device performance, device size, or both, are often candidates for improvement consideration in memory devices. However, as described in more details below, incorporating such improvements in some conventional memory devices (e.g., single-deck memory devices) may pose a challenge.

DETAILED DESCRIPTION

The techniques described herein include a memory device having multiple decks of memory cells. The memory device includes a separate page buffer circuitry for a respective deck among the decks of the memory device. Page buffer circuitries of the memory device can be located under a memory array of the memory device. The memory cells of the memory device are organized in blocks. Each of the blocks includes portions from different decks. The memory device includes different driver circuits for different blocks. The memory device includes different data lines (e.g., bit lines) for different decks. The data lines of one deck are electrically separate from data lines of another deck. The memory device includes different sets of access lines (e.g., word lines) for different blocks. The portions of the same block can share the same set of access lines. Other structures, operations, and improvements and benefits of the memory device are described in detail below with reference to FIG. 1 through FIG. 7.

Figure 1:
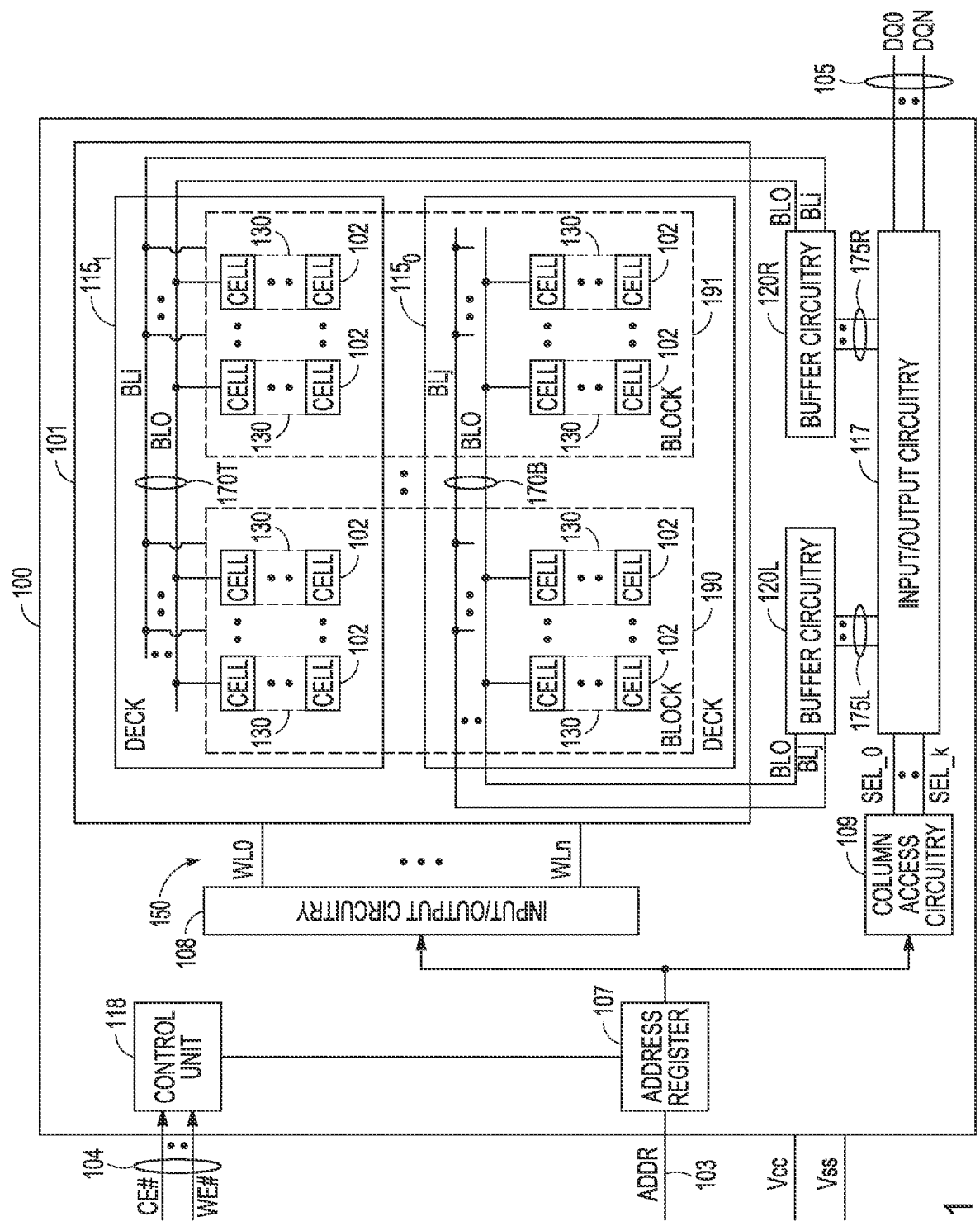
FIG. 1 shows a block diagram of an apparatus in the form of a memory device, according to some embodiments described herein.

FIG. 1 shows a block diagram of an apparatus in the form of a memory device 100, according to some embodiments described herein. Memory device 100 can include a device portion 101 that includes a memory array (or multiple memory arrays) having decks (decks of memory cells) $115_0$ and $115_1$. In the physical structure of memory device 100, decks $115_0$ and $115_1$ can be formed vertically (e.g., stacked one over another) over a substrate (e.g., a semiconductor substrate) of memory device 100. For example, deck $115_0$ can be formed over the substrate, and deck $115_1$ can be formed over deck $115_0$. In this example, deck $115_1$ can be a top deck and deck $115_0$ can be a bottom deck with respect to the location of the substrate.

As shown in FIG. 1, each of decks 1150 and 1151 can include memory cell strings 130. Each of memory cell strings 130 can include memory cells 102 coupled to each other in series. In the physical structure of memory device 100, memory cells 102 in each of memory cell strings 130 can be formed in different levels over the substrate of memory device 100 (e.g., formed vertically over the substrate of memory device 100).

Memory cell strings 130 can be organized into blocks (memory cell blocks) 190 and 191. Each of blocks 190 and 191 can include a portion of deck (e.g., bottom deck) $115_0$ and a portion of deck (e.g., top deck) $115_1$, such that each of blocks 190 and 191 can include some of memory cell strings 130 from deck $115_0$, and some of memory cell strings 130 from deck $115_1$.

FIG. 1 shows memory device 100 having two decks $115_0$ and $115_1$ and two blocks 190 and 191 as an example. Memory device 100 can have more than two decks of memory cells and more than two memory cell blocks.

As shown in FIG. 1, memory device 100 can include access lines 150 (which can include word lines). Access lines 150 can carry signals (e.g., word line signals) WL0 through WLm. Memory device 100 can use access lines 150 to access memory cells 102.

Memory device 100 can include data lines (e.g., top data lines) 170T and data lines (e.g., bottom data lines) 170B. Data lines 170T can include local bit lines for deck $115_0$. Data lines 170B can include local bit lines for deck $115_1$. Data lines 170T are electrically separated from data lines 170B. Data lines 170T can carry signals (e.g., bit line signals) BL0 through BLi. Data lines 170B can carry signals (e.g., bit line signals) BL0 through BLj. The number (quantity) of data lines 170B can be equal to the number (quantity) of data lines 170T. For example, memory device 100 can include $2^X$ data lines 170T and $2^X$ data lines 170B (where X is an integer greater than zero). As an example, X can be 16, such that there are 65,536 data lines 170T, and there are 65,536 data lines 170B.

As shown in FIG. 1, memory cell strings 130 of different portions (e.g., top and bottom portions) of each of blocks 190 and 191 can be coupled to respective data lines 170T and 170B. For example, memory cell strings 130 of the portion (e.g., top portion) of block 190 in deck $115_1$ can be coupled to data lines 170T, and memory cell strings 130 of the portion (e.g., bottom portion) of block 190 in deck $115_0$ can be coupled to data lines 170B. Similarly, memory cell strings 130 of the portion (e.g., top portion) of block 191 in deck $115_1$ can be coupled to data lines 170T, and memory cell strings 130 of the portion (e.g., bottom portion) of block 191 in deck $115_0$ can be coupled to data lines 170B. Thus, data lines 170T can be shared by respective portions (e.g., top portions) of blocks 190 and 191. Data lines 170B can be shared by respective portions (e.g., bottom portions) of blocks 190 and 191.

Memory device 100 can include an address register 107 to receive address information (e.g., address signals) ADDR on lines (e.g., address lines) 103. Memory device 100 can include row access circuitry 108 and column access circuitry 109 that can decode address information from address register 107. Based on decoded address information, memory device 100 can determine which block among the blocks (e.g., blocks 190 and 191) of memory device 100 is selected to be accessed during a memory operation and which memory cells (e.g., which of memory cells 102) of the selected block are to be accessed during the memory operation.

Memory device 100 can include a control unit 118 that can be configured to control memory operations of memory device 100 based on control signals on lines 104. Examples of the control signals on lines 104 include one or more clock signals and other signals (e.g., a chip enable signal CE #, a write enable signal WE #) to indicate which operation (e.g., read, write, or erase operation) memory device 100 can perform.

Memory device 100 can perform a read operation to read (e.g., sense) information (e.g., previously stored information) from memory cells 102 of selected memory cell strings 130 of a selected block among the blocks (e.g., blocks 190 and 191) of memory device 100. Memory device 100 can perform a write (e.g., programming) operation to store (e.g., program) information in memory cells 102 of selected memory cell strings 130 of a selected block among the blocks (e.g., blocks 190 and 191) of memory device 100. Memory device 100 can also perform an erase operation to erase information from some or all of memory cells 102 of blocks 190 and 191. Control unit 118 can be implemented with (e.g., can include) hardware, firmware, software, or any combination of hardware, firmware, and software that can be configured to allow memory device 100 to perform operations (e.g., read, write, and erase operations) described herein.

In a read operation, memory device 100 can use data lines 1709 to read information (e.g., data) from selected memory cell strings 130 of a portion (e.g., bottom portion) in deck $115_0$ of a selected block (e.g., one of blocks 190 and 191), and data lines 170T to read information (e.g., data) from selected memory cell strings 130 of a portion (e.g., top portion) in deck $115_1$ of a selected block (e.g., one of blocks 190 and 191). Information from the selected memory cell strings 130 of portions (top and bottom portions) in respective decks $115_0$ and $115_1$ of the selected block can be concurrently (e.g., simultaneously) provided to data lines 170B and 170T.

In a write operation, information (e.g., data) to be stored in selected memory cell strings 130 of a portion (e.g., bottom portion) in deck $115_0$ of a selected block (e.g., one of blocks 190 and 191) can be based on information (e.g., in the form of signals) on data lines 170B, and information (e.g., data) to be stored in selected memory cell strings 130 of a portion (e.g., top portion) in deck $115_1$ of a selected block (e.g., one of blocks 190 and 191) can be based on information (e.g., in the form of signals) on data lines 170T. Information can be concurrently (e.g., simultaneously) stored in selected memory cell strings 130 of the portions (top and bottom portions) in respective decks $115_0$ and $115_1$ of the selected block.

Memory device 100 can include buffer circuitry (e.g., left buffer circuitry) 120L and buffer circuitry (e.g., right buffer circuitry) 120R. Buffer circuitry 120L can be coupled to data lines 170B. Buffer circuitry 120R can be coupled to data lines 170T. Each of buffer circuitries 120L and 120R can include components, for example, sense amplifiers and page buffer circuits (e.g., data latches).

Buffer circuitry 120L can be configured to determine (e.g., by sensing) and store (e.g., temporarily store) the value of information read from selected memory cell strings 130 of a portion (e.g., bottom portion) of a selected block (e.g., one of blocks 190 and 191) in deck $115_0$. Buffer circuitry 120L can store (e.g., temporary store) information (e.g., write data during a write operation) that is to be stored in a portion (e.g., top portion) in deck $115_1$ of blocks 190 and 191.

Similarly, buffer circuitry 120R can be configured to determine (e.g., by sensing) and store (e.g., temporarily store) the value of information read from selected memory cell strings 130 of a portion (e.g., top portion) of a selected block (e.g., one of blocks 190 and 191) in deck $115_1$. Buffer circuitry 120R can store (e.g., temporarily store) information (e.g., write data during a write operation) that is to be stored in a portion (e.g., top portion) of blocks 190 and 191.

Memory device 100 can include input/output (I/O) circuitry 117 that can respond to signals SEL_0 through SEL_k from column access circuitry 109 during a read and write operation. During a read operation, buffer circuitries 120L and 120R can provide (e.g., pass) information read from a selected block (e.g., one of blocks 190 and 191) to I/O circuitry 117 through lines (e.g., internal bus) 175L and lines (e.g., internal bus) 175R, respectively. During a write operation, I/O circuitry 117 can selectively provide information (to be stored in a select block) to buffer circuitries 120L and 120R.

Memory device 100 can include lines (e.g., I/O lines) 105. Signals DQ0 through DQN on lines 105 can represent information read from or stored in memory cells 102 of decks $115_0$ and $115_1$. Lines 105 can include nodes within memory device 100 or pins (or solder balls) on a package of memory device 100. Other devices external to memory device 100 (e.g., a memory controller or a processor) can communicate with memory device 100 through lines 103, 104, and 105.

Memory device 100 can receive a supply voltage, including supply voltages $V_{CC}$ and $V_{SS}$. Supply voltage $V_{SS}$ can operate at a ground potential (e.g., having a value of approximately zero volts). Supply voltage $V_{CC}$ can include an external voltage supplied to memory device 100 from an external power source such as a battery or an alternating current to direct current (AC-DC) converter circuitry.

Each of memory cells 102 can be programmed to store information representing a value of a fraction of a bit, a value of a single bit, or a value of multiple bits such as two, three, four, or another number of bits. For example, each of memory cells 102 can be programmed to store information representing a binary value "0" or "1" of a single bit. The single bit per cell is sometimes called a single level cell. In another example, each of memory cells 102 can be programmed to store information representing a value for multiple bits, such as one of four possible values "00", "01", "10", and "11" of two bits, one of eight possible values "000", "001", "010", "011", "100", "101", "110", and "111" of three bits, or one of other values of another number of multiple bits. A cell that has the ability to store multiple bits is sometimes called a multi-level cell (or multi-state cell).

Memory device 100 can include a non-volatile memory device, and memory cells 102 can include non-volatile memory cells, such that memory cells 102 can retain information stored thereon when power (e.g., voltage $V_{CC}$, $V_{SS}$, or both) is disconnected from memory device 100. For example, memory device 100 can be a flash memory device, such as a NAND flash (e.g., 3-dimensional (3-D)) NAND) or a NOR flash memory device, or another kind of memory device, for example, a variable resistance memory device (e.g., a phase change memory device or a resistive RAM (Random Access Memory) device).

One of ordinary skill in the art may recognize that memory device 100 may include other components, several of which are not shown in FIG. 1 so as not to obscure the example embodiments described herein. At least a portion of memory device 100 can include structures and operations similar to or identical to any of the memory devices described below with reference to FIG. 2 through FIG. 7.

Figure 2:
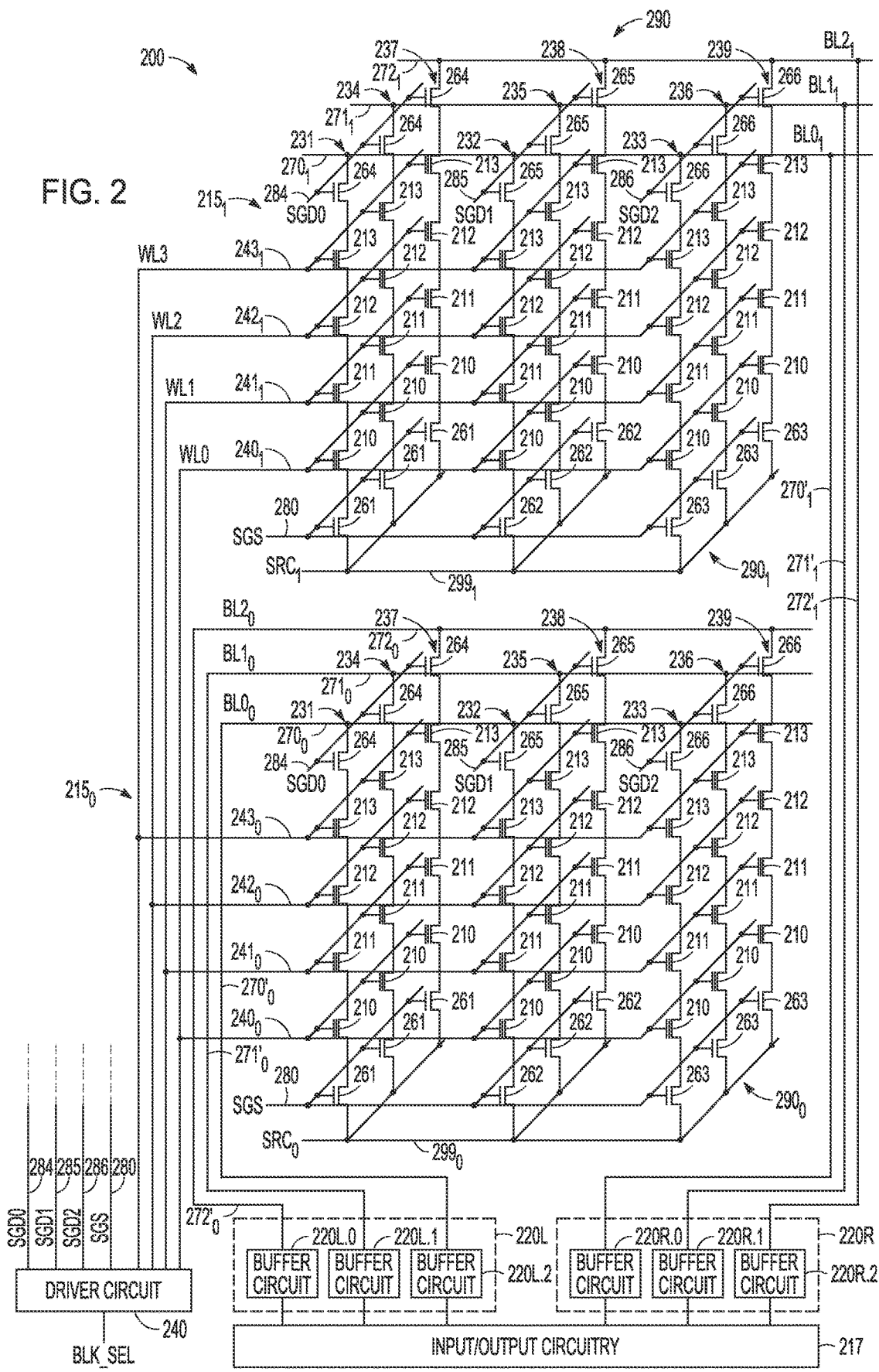
FIG. 2 shows a schematic diagram of a portion of a memory device including decks of memory cells of a memory cell block, according to some embodiments described herein.

FIG. 2 shows a schematic diagram of a portion of a memory device 200 including decks (decks of memory cells) $215_0$ and $215_1$ and a block (memory cell block) 290, according to some embodiments described herein. Memory device 200 can correspond to memory device 100 of FIG. 1. For example, decks $215_0$ and $215_1$ can correspond to decks $115_0$ and $115_1$, respectively, of FIG. 1, and block 290 can correspond to block 190 of FIG. 1. In another example, memory device 200 can include a control unit (not shown) that can correspond to control unit 118 of FIG. 1. The control unit of memory device 200 can be implemented with (e.g., can include) firmware, software, or any combination of hardware, firmware, and software that can be configured to allow memory device 200 to perform operations (e.g., read, write, and erase operations) described herein.

FIG. 2 shows directions (e.g., dimension) X, Y, and Z to indicate that, in the physical structure of memory device 200 (shown in FIG. 4 through FIG. 7), decks $215_0$ and $215_1$ can be located (e.g., formed) one over another over a substrate (e.g., a semiconductor substrate) in the Z-direction (e.g., arranged vertically over the substrate). The Z-direction is perpendicular to the X-direction and Y-direction (perpendicular to an X-Y plane).

As shown in FIG. 2, block 290 can include a portion (e.g., top portion) $290_1$ that is part of deck $215_1$ and a portion (e.g., bottom portion) $290_0$ that is part of deck $215_0$. For simplicity, FIG. 2 shows a schematic diagram of one block (e.g., block 290) of memory device 200. However, memory device 200 can also include additional blocks that are omitted from FIG. 2. For example, FIG. 4 (described below) shows a structure of memory device 200 including blocks (four blocks) 290, 291, 292, and 293. The other blocks (e.g., blocks 291, 292, and 293 in FIG. 4) of memory device 200 can include elements similar to the memory elements of block 290 schematically shown in FIG. 2.

Memory device 200 can include access lines (a set of access lines) 250, 251, 252, and 253 that can carry corresponding signals (e.g., word line signals) WL0, WL1, WL2, and WL3. Each of access lines 250, 251, 252, and 253 can be structured as a conductive line. Access lines 250, 251, 252, and 253 can include word lines of memory device 200. Memory device 200 can use the same set of access line (e.g., access lines 250, 251, 252, and 253) to access (e.g., concurrently) access portions $290_0$ and $290_1$ of block 290.

As shown in FIG. 2, deck $215_0$ can include control gates (e.g., memory cell control gates) $240_0$, $241_0$, $242_0$, and $243_0$ in portion $290_0$ of block 290. Control gates $240_0$, $241_0$, $242_0$, and $243_0$ can be coupled to (or can be part of) access lines 250, 251, 252, and 253, respectively. Deck $215_1$ can include control gates (e.g., memory cell control gates) $240_1$, $241_1$, $242_1$, and $243_1$ in portion $290_1$ of block 290. Control gates $240_1$, $241_1$, $242_1$, and $243_1$ can be coupled to (or can be part of) access lines 250, 251, 252, and 253, respectively.

Portions $290_0$ and $290_1$ of block 290 can share the same access lines (e.g., access lines 250, 251, 252, and 253), such that control gates of portions $290_0$ and $290_1$ that have the same relative position in decks $215_0$ and $215_1$ can share the same access (e.g., can be coupled to the same access line) to receive the same signal (e.g., the same word line signal). For example, as shown in FIG. 2, control gates $240_0$ and $240_1$ can be coupled to the same access line (e.g., access line 250) to receive the same signal (e.g., signal WL0). Control gates $241_0$ and $241_1$ can be coupled to the same access line (e.g., access line 251) to receive the same signal (e.g., signal WL1). Control gates $242_0$ and $242_1$ can be coupled to the same access line (e.g., access line 252) to receive the same signal (e.g., signal WL2). Control gates $243_0$ and $243_1$ can be coupled to the same access line (e.g., access line 253) to receive the same signal (e.g., signal WL3).

As shown in FIG. 2, deck $215_0$ can include data lines $270_0$, $271_0$, and $272_0$ that carry signals (e.g., bit line signals) $BL0_0$, $BL1_0$, and $BL2_0$, respectively. Each of data lines $270_0$, $271_0$, and $272_0$ can be structured as a conductive line that can include a bit line (e.g., local bit line) of deck $215_0$. Each of data lines $270_0$, $271_0$, and $272_0$ can have a length extending in the X-direction. Thus, the Y-direction can be perpendicular to the length of each data line $270_0$, $271_0$, and $272_0$.

Deck $215_1$ can include data lines $270_1$, $271_1$, and $272_1$ that carry signals (e.g., bit line signals) $BL0_1$, $BL1_1$, and $BL2_1$, respectively. Each of data lines $270_1$, $271_1$, and $272_1$ can be structured as a conductive line that can include a bit line (e.g., local bit line) of deck $215_1$. Each of data lines $270_1$, $271_1$, and $272_1$ can have a length extending in the X-direction. Thus, the Y-direction can be perpendicular to the length of each data line $270_1$, $271_1$, and $272_1$.

FIG. 2 shows each of deck $215_0$ and $215_1$ including three data lines, four control gates, and four access line as an example. The number of data lines, control gates, and access lines of memory device 200 can vary.

As mentioned above, FIG. 2 omits other blocks (e.g., blocks 291, 292, and 293 shown in FIG. 4) of memory device 200. However, a portion (e.g., bottom portion) of each of other blocks (e.g., blocks 291, 292, and 293 shown in FIG. 4) of memory device 200 can share (e.g., can be coupled to) data lines $270_0$, $271_0$, and $272_0$ with portion $290_0$ of block 290. A portion (e.g., top portion) of each of other blocks (e.g., blocks 291, 292, and 293 shown in FIG. 4) of memory device 200 can share (e.g., can be coupled to) data lines $270_1$, $271_1$, and $272_1$ with portion $290_1$ of block 290.

A shown in FIG. 2, data lines $270_0$, $271_0$, and $272_0$ of deck $215_1$ are separated from and not coupled to (e.g., electrically unconnected to) data lines $270_1$, $271_1$, and $272_1$ of deck $215_1$. Thus, during a read operation performed on block 290, memory device 200 can use data lines $270_0$, $271_0$, and $272_0$ to carry information read from memory cells in portion $290_0$ of block 290, and data lines $270_1$, $271_1$, and $272_1$ to carry information read from memory cells in portion $290_1$ of block 290. Thus, data lines $270_0$, $270_1$, $271_0$, $271_1$, $272_0$, and $272_1$ can concurrently (e.g., simultaneously) carry information read from respective portions $290_0$ and $290_1$ of block 290. In a write operation performed on block 290, information to be concurrently stored in portions $290_0$ and $290_1$ of block 290 can be based on the information on respective data lines $270_0$, $270_1$, $271_0$, $271_1$, $272_0$, and $272_1$.

As shown in FIG. 2, decks $215_0$ and $215_1$ have similar elements. Thus, for simplicity, similar elements between decks $215_0$ and $215_1$ are given the same designation labels (e.g., reference numbers). The following description focuses on details of portion (e.g., bottom portion) $290_0$ of block 290. The elements of portion (e.g., top portion) $290_1$ of block 290 can have a similar description (which is not described in detail below for simplicity).

As shown in FIG. 2, portion $290_0$ of block 290 includes memory cells 210, 211, 212, and 213; select transistors (e.g., source select transistors) 261, 262, and 263; and select transistors (e.g., drain select transistors) 264, 265, and 266. Memory cells 210, 211, 212, and 213 can be arranged in memory cell strings, such as memory cell strings 231 through 239. Deck $215_0$ can include a line $299_0$ that can carry a signal $SRC_0$ (e.g., source line signal). Line $299_0$ can be structured as a conductive region (e.g., conductive line or alternatively a conductive plate) that can form part of a source (e.g., a source line or alternatively a source plate) of deck $215_0$ of memory device 200.

Each of memory cell strings 231 through 239 of portion $290_0$ of block 290 (located in deck $215_0$) can be coupled to one of data lines $270_0$, $271_0$, and $272_0$ through one of select transistors 264, 265 and 266. Each of memory cell strings 231 through 239 of portion $290_0$ of block 290 can also be coupled to line $299_0$ through one of select transistors 261, 262, and 263. For example, memory cell string 231 can be coupled to data line $270_0$ through select transistor 264 (directly over memory cell string 231) and to line $299_0$ through select transistor 261 (directly under memory cell string 231). In another example, memory cell string 232 can be coupled to data line $270_0$ through select transistor 265 (directly over memory cell string 232) and to line $299_0$ through transistor 262 (directly under memory cell string 232). FIG. 2 shows an example of nine memory cell strings 231 through 239 and four memory cells 210, 211, 212, and 213 in each memory cell string. However, the number of memory cell strings and the number of memory cells in each memory cell string of portion $290_0$ of block 290 can vary.

As shown in FIG. 2, some memory cells (e.g., memory cells 213) of different memory cell strings (e.g., memory cell strings 231 through 239) can be controlled by the same control gate (e.g., control gate $243_0$) and can be coupled to the same access line (e.g., access line 253). Some other memory cells (e.g., memory cells 212) of these memory cell strings (e.g., memory cell strings 231 through 239) can be controlled by another control gate (e.g., control gate $242_0$). Each of control gates $240_0$, $241_0$, $242_0$, and $243_0$ can be structured as a single conductive plate (shown in FIG. 4 through FIG. 7). During a memory operation performed on block 290 of memory device 200, control gates $240_0$, $241_0$, $242_0$, and $243_0$ can receive respective signals WL0, WL1, WL2, and WL3 (through respective access lines 250, 251, 252, and 253) to access memory cells 210, 211, 212, and 213 of selected memory cell strings among memory cell strings 231 through 239 of portion $290_0$ of block 290.

As shown in FIG. 2, select transistors 261, 262, and 263 of portion $290_0$ of block 290 can be coupled to a select line (e.g., source select line) 280, and can be controlled (e.g., turned on or turned off) by the same signal, such as an SGS signal (e.g., source select gate signal) applied to select line 280. During a memory operation (e.g., a read or write operation) performed on block 290, select transistors 261, 262, and 263 can be turned on (e.g., by activating the SGS signal) to couple memory cell strings 231 through 239 of portion $290_0$ of block 290 to line $299_0$. Select transistors 261, 262, and 263 of portion $290_0$ of block 290 can be turned off (e.g., by deactivating the SGS signal) to decouple memory cell strings 231 through 239 of portion $290_0$ of block 290 from line $299_0$.

Select transistors 264, 265, and 266 of portion $290_0$ of block 290 can be coupled to select lines (e.g., drain select lines) 284, 285, and 286, respectively, and can be controlled (e.g., turned on or turned off) by corresponding signals SGD0, SGD1, and SGD2 (e.g., drain select gate signals). During a memory operation (e.g., a read or write operation) select transistors 264, 265, and 266 can be selectively turned on (e.g., by selectively activating signals SGD0, SGD1, and SGD2) to selectively couple the memory cell strings of portion $290_0$ of block 290 to their respective data lines $270_0$, $271_0$, and $272_0$. Select transistors 264, 265, and 266 of portion $290_0$ of block 290 can be selectively turned off (e.g., by selectively deactivating signals SGD0, SGD1, and SGD2) to selectively decouple the memory cell strings of portion $290_0$ of block 290 from their respective data lines $270_0$, $271_0$, and $272_0$.

During a memory operation (e.g., a read or write operation), only one of the signals SGD0, SGD1, and SGD2 can be activated at a time (e.g., the signals can be sequentially activated). For example, during a read operation to read (e.g., sense) information from memory cell strings 231, 234, and 237, signal SGD0 can be activated to turn on transistors 264 of portion $290_0$ of block 290 and couple memory cell strings 231, 234, and 237 of portion $290_0$ of block 290 to data lines $270_0$, $271_0$, and $272_0$, respectively. In this example, signals SGD1 and SGD2 can be deactivated (while signal SGD0 is activated) to decouple memory cell strings 232, 235, 238, 233, 236, and 239 of portion $290_0$ of block 290 from data lines $270_0$, $271_0$, and $272_0$. In another example, during a read operation to read information from memory cell strings 232, 235, and 238, signal SGD1 can be activated to turn on transistors 265 of portion $290_0$ of block 290 and couple memory cell strings 232, 235, and 238 of portion $290_0$ of block 290 to data lines $270_0$, $271_0$, and $272_0$, respectively. In this example, signals SGD0 and SGD2 can be deactivated (while signal SGD1 is activated) to decouple memory cell strings 231, 234, 237, 233, 236, and 239 of portion $290_0$ of block 290 from data lines $270_0$, $271_0$, and $272_0$.

As mentioned above, portion $290_1$ of block 290 in deck $215_1$ includes elements similar to those of portion $290_0$ of block 290 in deck $215_0$. For example, as shown in FIG. 2, portion $290_1$ of block 290 in deck $215_1$ can include memory cell strings 231 through 239; select transistors (e.g., source select transistors) 261, 262, and 263; select transistors (e.g., drain select transistors) 264, 265, and 266; select line (e.g., source select line) 280 and corresponding signal SGS (e.g., source select gate signal); line $299_1$ (e.g., source line, source region, or source plate) and corresponding signal (e.g., source line signal) $SRC_1$; select lines (e.g., drain select lines) 284, 285, and 286 and corresponding signals (e.g., drain select gate signals) SGD0, SGD1, and SDG2.

Portions $290_0$ and $290_1$ of block 290 can share the same select lines (e.g., source select line 280 and drain select lines 284, 285, and 286). For example, FIG. 2 shows the same labels for select lines (e.g., drain select lines) 284, 285, and 286 and for signals SGD0, SDG1, and SDG2, in both portions $290_0$ and $290_1$ of block 290 to indicate that portions $290_0$ and $290_1$ can share select lines 284, 285, and 286 and signals SGD0, SDG1, and SDG2. In another example, FIG. 2 shows the same label for select line (e.g., source select line) 280 and for signal SGS in both portions $290_0$ and $290_1$ of block 290 to indicate that portions $290_0$ and $290_1$ can share select line 280 and signal SGS.

Thus, select lines 284, 285, and 286 of portion $290_0$ can be coupled to (e.g., electrically in contact with) select lines 284, 285, and 286 of portion $290_1$, respectively. Select line 280 of portion $290_0$ can be coupled to (e.g., electrically in contact with) select line 280 of portion $290_1$. For simplicity, FIG. 2 omits the connections (e.g., connecting lines) between select lines 284, 285, and 286 of portion $290_0$ and select lines 284, 285, and 286 of portion $290_1$, respectively, and omits a connection between select line 280 of portion $290_0$ and select line 280 of portion $290_1$.

Since portions $290_0$ and $290_1$ of block 290 can share the same select lines (e.g., source select line 280 and drain select lines 284, 285, and 286), select transistors (e.g., source select transistors) 261, 262, and 263 of portions $290_0$ and $290_1$ can be coupled to the same select line (e.g., source select line 280) to receive the same signal (e.g., signal SGS).

Similarly, select transistors (e.g., drain select transistors) 264 of portions $290_0$ and $290_1$ can be coupled to the same select line (e.g., select line 284) to receive the same signal (e.g., signal SGD0). Select transistors (e.g., drain select transistors) 265 of portions $290_0$ and $290_1$ can be coupled to the same select line (e.g., drain select line 285) to receive the same signal (e.g., signal SGD1). Select transistors (e.g., drain select transistors) 266 of portions $290_0$ and $290_1$ can be coupled to the same select line (e.g., drain select line 286) to receive the same signal (e.g., signal SGD2).

As shown in FIG. 2, different memory cell strings in the X-direction (e.g., memory cell strings coupled to different drain select lines) in portion $290_0$ can share a data line among data lines $270_0$, $271_0$, and $272_0$. For example, in portion $290_0$, memory cell strings 231, 232, and 233 can share data line $270_0$. Memory cell strings 234, 235, and 236 can share data line $271_0$. Memory cell strings 237, 238, and 239 can share data line $272_0$.

However, memory cell strings within the same group in the Y-direction (e.g., memory cell strings coupled to the same drain select line) in portion $290_0$ may not share a data line (e.g., may be coupled to a separate data line). For example, in portion $290_0$, memory cell strings 231, 234, and 237 can be coupled to data lines $270_0$, $271_0$, and $272_0$, respectively, such that memory cell strings 231, 234, and 237 may not share data lines $270_0$, $271_0$, and $272_0$. In another example, in portion $290_0$, memory cell strings 232, 235, and 238 can be coupled to data lines $270_0$, $271_0$, and $272_0$, respectively, such that memory cell strings 232, 235, and 238 may not share data lines $270_0$, $271_0$, and $272_0$.

Similarly, different memory cell strings in the X-direction (e.g., memory cell strings coupled to different drain select lines) in portion $290_1$ can share a data line among data lines $270_1$, $271_1$, and $272_1$. However, memory cell strings within the same group in the Y-direction memory cell strings coupled to the same drain select line) in portion $290_1$ may not share a data line (e.g., may be coupled to a separate data line).

As shown in FIG. 2, memory device 200 can include a driver circuit (e.g., string driver circuit) 240; buffer circuitry 220R and 220L; conductive paths $270'_0$, $271'_0$, and $272'_0$ coupled to (e.g., coupled directly between) buffer circuitry 220L and data lines $270_0$, $271_0$, and $272_0$, respectively; conductive paths $270'_1$, $271'_1$, and $272'_1$ coupled to (e.g., coupled directly between) buffer circuitry 220R and data lines $270_1$, $271_1$, and $272_1$, respectively; and an input/output circuitry 217. Conductive paths $270'_0$, $271'_0$, and $272'_0$ can be considered as part of data lines $270_0$, $271_0$, and $272_0$, respectively. Conductive paths $270'_1$, $271'_1$, and $272'_1$ can be considered as part of data lines $270_1$, $271_1$, and $272_1$, respectively. Each of conductive paths $270'_0$, $271'_0$, $272'_0$, $270'_1$, $271'_1$, and $272'_1$ can have a length extending in a direction (e.g., Z-direction) from deck $215_0$ to deck $215_1$ (e.g., extending vertically in the Z-direction).

Thus, as shown in FIG. 2, no deck among the decks (e.g., $215_0$ and $215_1$) of memory device 200 shares a data line (or data lines) of the data lines (e.g., $270_0$, $271_0$, $272_0$, $270_1$, $271_1$, and $272_1$) of memory device 200 with another deck among the decks of memory device 200. For example, decks $215_0$ and $215_1$ share no data line (do not share a data line or data lines) among data lines $270_0$, $271_0$, $272_0$, $270_1$, $271_1$, and $272_1$ and share no conductive path (do not share a conductive path or conductive paths) among conductive paths $270'_0$, $271'_0$, $272'_0$, $270'_1$, $271'_1$, and $272'_1$.

Driver circuit 240 can be part of row access circuitry of memory device 200 that can correspond to row access circuitry 108 of FIG. 1. Memory device 200 can include a separate driver circuit for each block of memory device 200. Thus, in memory device 200, the number of driver circuits (e.g., string driver circuits) can be equal to the number of blocks of memory device 200. For example, memory device 200 can include 1024 driver circuits and 1024 blocks. Each of the driver circuits of memory device 200 can be controlled by (e.g., can respond to) a separate signal (e.g., a separate block select signal).

As shown in FIG. 2, driver circuit 240 can receive a signal (e.g., block select signal) BLK_SEL. During an operation (e.g., read, write, or erase operation) of memory device 200, driver circuit 240 can operate to apply voltages to the signals on access lines 250, 251, 252, and 253, select lines (e.g., drain select lines) 284, 285, and 286, and select line (e.g., source select line) 280. A decoder (e.g., decoder included in a row access circuitry) of memory device 200 can decode address information to determine which block among the blocks of memory device 200 is to be accessed during an operation of memory device 200. The decoder circuit of memory device 200 can activate signal BLK_SEL when block 290 is selected during a read, write, or erase operation of memory device 200.

Buffer circuitries 220L and 220R can be part of the buffer circuitry of memory device 200 that can correspond to and operate in ways similar to (or the same as) buffer circuitries 120L and 120R, respectively, of FIG. 1. As shown in FIG. 2, buffer circuitry 220L can include buffer circuits (e.g., page buffer circuits) 220L.0, 220L.1, and 220L.2 coupled to data lines $270_0$, $271_0$, and $272_0$, respectively. Each of buffer circuits 220L.0, 220L.1, and 220L.2 can include a sense amplifier to sense information (e.g., in the form of a signal) on a respective data line (among data lines $270_0$, $271_0$, and $272_0$) and a data latch stores (e.g., temporarily stores) one bit (or multiple bits) of information carried by the respective data line. FIG. 2 shows three buffer circuits 220L.0, 220L.1, and 220L.2 as an example. However, the number of buffer circuits of buffer circuitry 220L can be equal to the number of data lines of deck $215_0$. For example, if the number of data lines of deck $215_0$ is 65,536, then the number of buffer circuits of buffer circuitry 220L can also be 65,536.

Similarly, buffer circuitry 220R can include buffer circuits (e.g., page buffer circuits) 220R.0, 220R.1, and 220R.2 coupled to data lines $270_1$, $271_1$, and $272_1$, respectively. Each of buffer circuits 220R.0, 220R.1, and 220R.2 can include a sense amplifier to sense information (e.g., in the form of a signal) on a respective data line (among data lines $270_1$, $271_1$, and $272_1$) and a data latch stores (e.g., temporarily stores) one bit (or multiple bits) of information carried by the respective data line. FIG. 2 shows three buffer circuits 220R.0, 220R.1, and 220R.2 as an example. However, the number of buffer circuits of buffer circuitry 220R can be equal to the number of data lines of deck $215_1$. For example, if the number of data lines of deck $215_1$ is 65,536, then the number of buffer circuits of buffer circuitry 220R can also be 65,536. The number of buffer circuits of buffer circuitry 220R can be equal to the number of buffer circuits of buffer circuitry 220L.

During a read operation, information from selected memory cell strings 130 of portions $290_0$ and $290_1$ of block 290 can be concurrently (e.g., simultaneously) provided to buffer circuitries 220L and 220R, respectively, through data lines 170B and 170T, respectively. For example, information from data lines $270_0$, $271_0$, and $272_0$ during a read operation can be concurrently (e.g., simultaneously) provided to buffer circuits 220L.0, 220L.1, and 220L.2, respectively. Information from data lines $270_1$, $271_1$, and $272_1$ can be concurrently (e.g., simultaneously) provided to buffer circuits 220R.0, 220R.1, and 220R.2, respectively, while information from data lines $270_0$, $271_0$, and $272_0$ is concurrently provided to buffer circuits 220L.0, 220L.1, and 220L.2, respectively.

During a write operation, information can be concurrently (e.g., simultaneously) stored in portions $290_0$ and $290_1$ of block 290. Information to be stored in portion $290_0$ can be based in information in buffer circuitry 220L. Information to be stored in portion $290_1$ can be based on information in buffer circuitry 220R.

Input/output (I/O) circuitry 217 of memory device 200 can correspond to and operate in ways similar to (or the same as) input/output circuitry 117 of FIG. 1. For example, during a read operation of memory device 200, I/O circuitry 217 can selectively receive information (e.g., information read from block 290) from buffer circuitries 120L and 120R. During a write operation, I/O circuitry 217 can selectively provide information (information to be stored in block 290) to buffer circuitries 120L and 120R. During a read operation, buffer circuitries 220L and 220R can provide (e.g., pass) information read from block 290 to I/O circuitry 217. During a write operation, I/O circuitry 217 can selectively provide information (to be stored in a select block) to buffer circuitries 220L and 220R.

Memory device 200 can be configured such that information from buffer circuitries 220L and 220R during a read operation can be provided to I/O circuitry 217 in one of many different ways. In an example configuration of memory device 200, bits of information from buffer circuitry 220R during a read operation can be passed to I/O circuitry 217 before bits of information from buffer circuitry 220L can be passed to I/O circuitry 217. In this example configuration, B bits at a time can be passed (e.g., using a multiplexer in I/O circuitry 217 or in buffer circuitry 220R) from buffer circuitry 220R to I/O circuitry 217 until all bits of information from buffer circuitry 220R are passed to I/O circuitry 217. B is an integer greater than one (e.g., B=8, 16, 32 or another number) and less than the number of buffer circuits of each of buffer circuitries 220L and 220R. B can be the bandwidth of an internal bus (e.g., B-bitwide bus) between I/O circuitry 217 and each of buffer circuitries 220R and 220L. In this example configuration, the bits of information from buffer circuitry 220L during a read operation can be passed to I/O circuitry 217 after all bits of information from buffer circuitry 220R are passed to I/O circuitry 217. For example, B bits at a time can be passed (e.g., using a multiplexer in I/O circuitry 217 or in buffer circuitry 220L) from buffer circuitry 220L to I/O circuitry 217 until all bits of information from buffer circuitry 220L are passed to I/O circuitry 217.

In another example configuration of memory device 200, bits of information from buffer circuitry 220L during a read operation can be passed to I/O circuitry 217 before bits of information from buffer circuitry 220R can be passed to I/O circuitry 217. In this example configuration, B bits at a time can be passed (e.g., using a multiplexer in I/O circuitry 217 or in buffer circuitry 220R) from buffer circuitry 220L to I/O circuitry 217 until all bits of information from buffer circuitry 220L are passed to I/O circuitry 217. In this example configuration, the bits of information from buffer circuitry 220R during a read operation can be passed to I/O circuitry 217 after all bits of information from buffer circuitry 220L are passed to I/O circuitry 217. For example, B bits at a time can be passed from buffer circuitry 220R to I/O circuitry 217 until all bits of information from buffer circuitry 220R are passed to I/O circuitry 217.

In another example configuration, bits of information during a read operation from buffer circuitries 220L and 220R can be alternately passed (e.g., passed in an interleave fashion) to the I/O circuitry 217. For example, S bit (or S bits) from buffer circuitry 220R can be passed to I/O circuitry 217, then S bit (or S bits) from buffer circuitry 220L can be passed to I/O circuitry 217, where S is an integer equal to or greater than one. In this example, S bit (or S bits) at a time from each of buffer circuitries 220L and 220R can be alternately passed to I/O circuitry 217 until all bits of information from buffer circuitries 220L and 220R are passed to I/0 circuitry 217. In this example configuration, S bit (or S bits) from either buffer circuitry 220L or buffer circuitry 220R can be selected as the first bit (or bits) to be passed to I/O circuitry 217.

Memory device 200 can be configured such that information to be stored in block 290 in a write operation can be provided to buffer circuitries 220L and 220R in one of many different ways. For example, memory device 200 can be configured to have any of the example configurations described above for a read operation but in a reverse manner.

As an example, information to be stored in portion $290_1$ of block 290 during a write operation can be passed B bits at a time from I/O circuitry 217 to buffer circuitry 220R. Information to be stored in portion $290_0$ of block 290 during a write operation can be passed B bits at a time from I/O circuitry 217 to buffer circuitry 220L. In this example, information to be stored in portion $290_0$ of block 290 can be passed from I/O circuitry 217 to buffer circuitry 220L after information to be stored in portion $290_1$ of block 290 are passed from I/O circuitry 217 to buffer circuitry 220R. Alternatively, information to be stored in portion $290_1$ of block 290 can be passed from I/O circuitry 217 to buffer circuitry 220R after information to be stored in portion $290_0$ of block 290 are passed from I/O circuitry 217 to buffer circuitry 220L.

In another example, information to be stored in block 290 during a write operation can be alternately passed (e.g., passed in an interleave fashion) from I/O circuitry 217 to buffer circuitries 220L and 220R. For example, S bit (or S bits) among the bits of information to be stored in portion $290_1$ of block can be passed from I/O circuitry 217 to buffer circuitry 220R, and S bit (or S bits) among the bits of information to be stored in portion $290_0$ of block 290 can be passed from I/O circuitry 217 to buffer circuitry 220L in an interleave fashion. In this example, I/O circuitry 217 can be configured to pass S bit (or S bits) to be either buffer circuitry 220L or buffer circuitry 220R as the first bit (or bits).

A memory cell block (e.g., block 290) of a memory device (e.g., memory device 200) described herein is a group of memory cells (e.g., memory cells 210, 211, 212, and 213 of block 290) in which fewer than all of the memory cells (or alternatively all of the memory cells) in the group of memory cells can be selected to store information (e.g., in a write operation) in or read information (e.g., in a read operation) from the selected memory cells. However, in an erase operation, all of the memory cells in the group of memory cells (e.g., memory cells 210, 211, 212, and 213 of block 290) are selected (e.g., automatically selected) even if some of the memory cells in the group of memory cells are available to store information (e.g., some of the memory cells in the group of memory cells have no stored information before the erase operation). Further, a memory cell block (e.g., block 290) of a memory device (e.g., memory device 200) described herein is a group of memory cells (e.g., memory cells 210, 211, 212, and 213 of block 290) that can have the same block address.

In a memory operation (e.g., read operation), memory device 200 can operate to concurrently (simultaneously) establish circuit paths (e.g., current paths) between data lines $270_0$, $271_0$, and $272_0$ and buffer circuitry 220L (e.g., through respective conductive paths $270'_0$, $271'_0$, and $272'_0$), and concurrently establish circuit paths (e.g., current paths) between data lines $270_1$, $271_1$, and $272_1$ and buffer circuitry 220R (e.g., through respective conductive paths $270'_1$, $271'_1$, and $272'_1$). Thus, circuit paths between data lines $270_0$, $271_0$, and $272_0$ and buffer circuitry 220L and the circuit paths between data lines $270_1$, $271_1$, and $272_1$ and buffer circuitry 220R can be concurrently established.

In an example operation of memory device 200, portions $290_0$ and $290_1$ can be concurrently selected (e.g., selected at the same time) to operate on memory cells 210, 211, 212, and 213 of portions $290_0$ and $290_1$. In this example, memory device 200 can access and store information in selected memory cells of each of portions $290_0$ and $290_1$ (e.g., if the operation is a write operation), read information from selected memory cells of each of portions $290_0$ and $290_1$ (e.g., if the operation is a read operation), or erase information from selected memory cells (e.g., or from all of memory cells) of each of portions $290_0$ and $290_1$ (e.g., if the operation is an erase operation).

Thus, as described above, memory device 200 can include separate data lines for different decks (e.g., data lines $270_0$, $271_0$, and $272_0$ for deck $215_0$, and data lines $270_1$, $271_1$, and $272_1$ for deck $215_1$), the same driver circuit (e.g., driver circuit 240) for different portions (e.g., portions $290_0$ and $290_1$) of block 290, and separate (e.g., dedicated) buffer circuitries (e.g., 220L and 220R) for different data lines $270_0$, $271_0$, and $272_0$, and data lines $270_1$, $271_1$, and $272_1$.

The elements and operations of memory device 200, as described above, can allow it to have improvements over some conventional memory devices. For example, memory device 200 can have fewer (e.g., 50% fewer) driver circuits for a given memory storage capacity in comparison with some conventional memory devices (e.g., conventional memory devices without multiple decks of memory cells). Fewer driver circuits can allow memory device 200 to have a relatively smaller device size (e.g., chip size) than some convention memory devices. In another example, the multi-deck structure of memory device 200 allows it to have a relatively shorter control gates (e.g., control gates $240_0$, $241_0$, $242_0$, and $243_0$) than some conventional memory devices for a given memory storage capacity. This can lead to an improvement in at least part of a memory operation (e.g., shorter access time in read or write operation) of memory device 200. In another example, respective drain select lines (e.g., drain select lines 284, 285, and 286 in FIG. 2) of different portions in the multi-deck structure of each of the blocks (e.g., block 290) of memory device 200 are electrically coupled to each other. Thus, a relatively larger memory unit (e.g., larger page size) can be accessed in a memory operation (e.g., read or write operation) of memory device 200 in comparison with some conventional memory devices. In a further example, each of the memory cell strings in the Y-direction (e.g., memory cell strings 231, 234, and 237 in portion $290_1$ of FIG. 2) is coupled to a separate data lines (e.g., one of data lines $270_1$, $271_1$, and $272_1$). This can allow memory device 200 to provide an optimal (e.g., maximum) access unit (e.g., page size) among the memory cell strings in the memory cell block of memory device 200 in comparison with some conventional memory devices.

Figure 3:
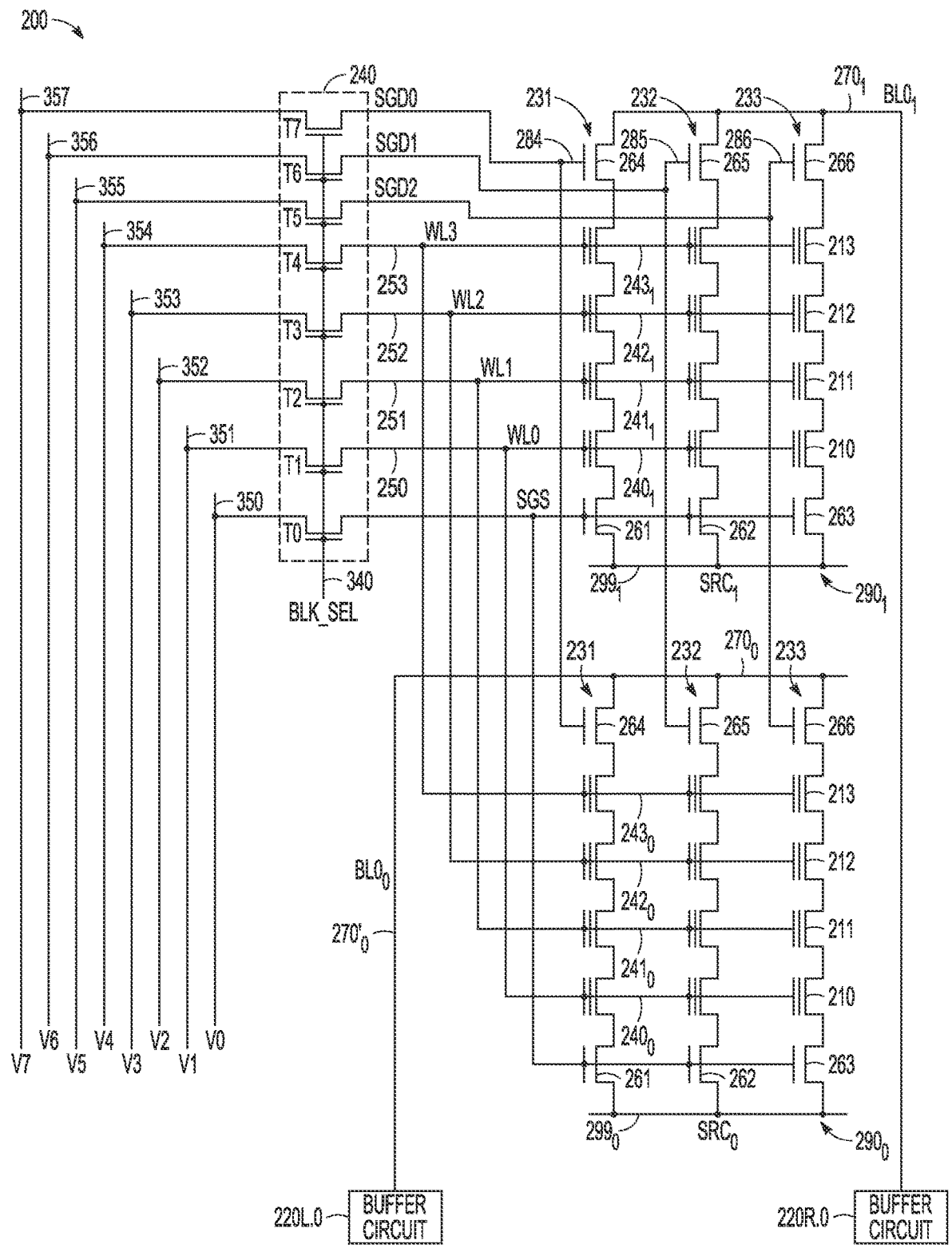
FIG. 3 shows a schematic diagram of a portion of the memory device of FIG. 2 including details of a driver circuit of the memory device and associated conductive lines coupled to the driver circuit, according to some embodiments described herein.

FIG. 3 shows a schematic diagram of a portion of memory device 200 of FIG. 2 including details of driver circuit 240 and associated conductive lines coupled to driver circuit 240, according to some embodiments described herein. FIG. 3 also shows the portion of memory device 200 including memory cell strings 231, 232, and 233 and associated electrical connections. Other memory cell strings (shown in FIG. 2) of memory device 200 can have similar electrical connections. Further, memory cell strings (shown in FIG. 2) of memory device 200 can be, coupled to driver circuit 240 in ways similar to that of memory cell strings 231, 232, and 233 are coupled to driver circuit 240.

As shown in FIG. 3, driver circuit 240 can include transistors (e.g., high-voltage drive transistor) T0 through T7. Transistors T0 through T7 can have a transistor gate 340 (e.g., a common gate, which is common to transistors T0). Thus, transistors T0 through T7 can be controlled (e.g., turned on at the same time or turned off at the same time) using the same transistor gate (e.g., transistor gate 340).

Memory device 200 can include conductive lines 350 through 357, each of which can carry a signal (e.g., voltage signal, which is different from a data signal). As an example, conductive lines 350 through 337 can carry signals (e.g., voltage signal) V0 through V7, respectively. Driver circuit 240 can use transistors T0 through T7 to provide (e.g., drive) signals from conductive lines 350 through 357 to respective elements (e.g., respective control lines and drain/source select lines) of portions $290_0$ and $290_1$ of block 290. For example, driver circuit 240 can use transistor T0 to provide signal V0 to select line 280 of both portions $290_0$ and $290_1$. Driver circuit 240 can use transistors T1, T2, T3, and T4 to provide signals V1, V2, V3, and V4 to respective access lines 250, 251, 252, and 253, and then to control gates $240_0$, $241_0$, $242_0$, and $243_0$, respectively, and to control gates $240_1$, $241_1$, $242_1$, and $243_1$, respectively. Driver circuit 240 can use transistors T5, T6, and T7 to provide signals V5, V6, and V7 to select lines 286, 285, and 284, respectively, of both portions $290_0$ and $290_1$.

During an operation (e.g., a read or write operation) of memory device 200, if block 290 is selected to be accessed (to operate on memory cells 210, 211, 212, and 213 of block 290), signal BLK_SEL can be activated. In this example, transistors T0 through T7 can be turned on (e.g., concurrently turned on by signal BLK_SEL) to establish circuit paths (e.g., current paths) between conductive lines 350 through 357 and respective select line 280, access lines 250, 251, 252, and 253, and select lines 286, 285, and 284 through transistors T1 through T7, respectively. This allows signals V0 through V7 to be applied to select line 280, access lines 250, 251, 252, and 253, and select lines 286, 285, and 284, respectively. In an operation (e.g., read, write, or erase) performed on block 290, signals V0 through V7 can have different values (e.g., voltage values) and two or more of signals V0 through V7 can have the same value, depending on which operation memory device 200 performs and which memory cells among memory cells 210, 211, 212, and 213 are selected. The voltage values of signals V0 through V7 can be any combination of 0V (e.g., ground potential), the value of the supply voltage (e.g., $V_{CC}$) of memory device 200, and a value greater than the value of the supply voltage of memory device 200.

As shown in FIG. 3, data line $270_0$ of portion $290_0$ of block 290 and data line $270_1$ of portion $290_1$ of block 290 can be coupled to different buffer circuits (e.g., buffer circuit 220L.0 and 220R.0, respectively, which are also shown in FIG. 2). This connection and structure (as shown in FIG. 3) allow information read from a memory cell of a selected memory cell string (e.g., one of memory cell strings 231, 232, and 233) of portion $290_0$, and information read from a memory cell of a selected memory cell string (e.g., one of memory cell strings 231, 232, and 233) of portion $290_1$ to be concurrently passed to buffer circuits 220L.0 and 220R.0, respectively, in a read operation. In a write operation, information to be stored in a memory cell of a selected memory cell string (e.g., one of memory cell strings 231, 232, and 233) of portion $290_0$, and information to be stored in a memory cell of a selected memory cell string (e.g., one of memory cell strings 231, 232, and 233) of portion $290_1$ can be based on buffer circuits 220L.0 and 220R.0, respectively.

Figure 4:
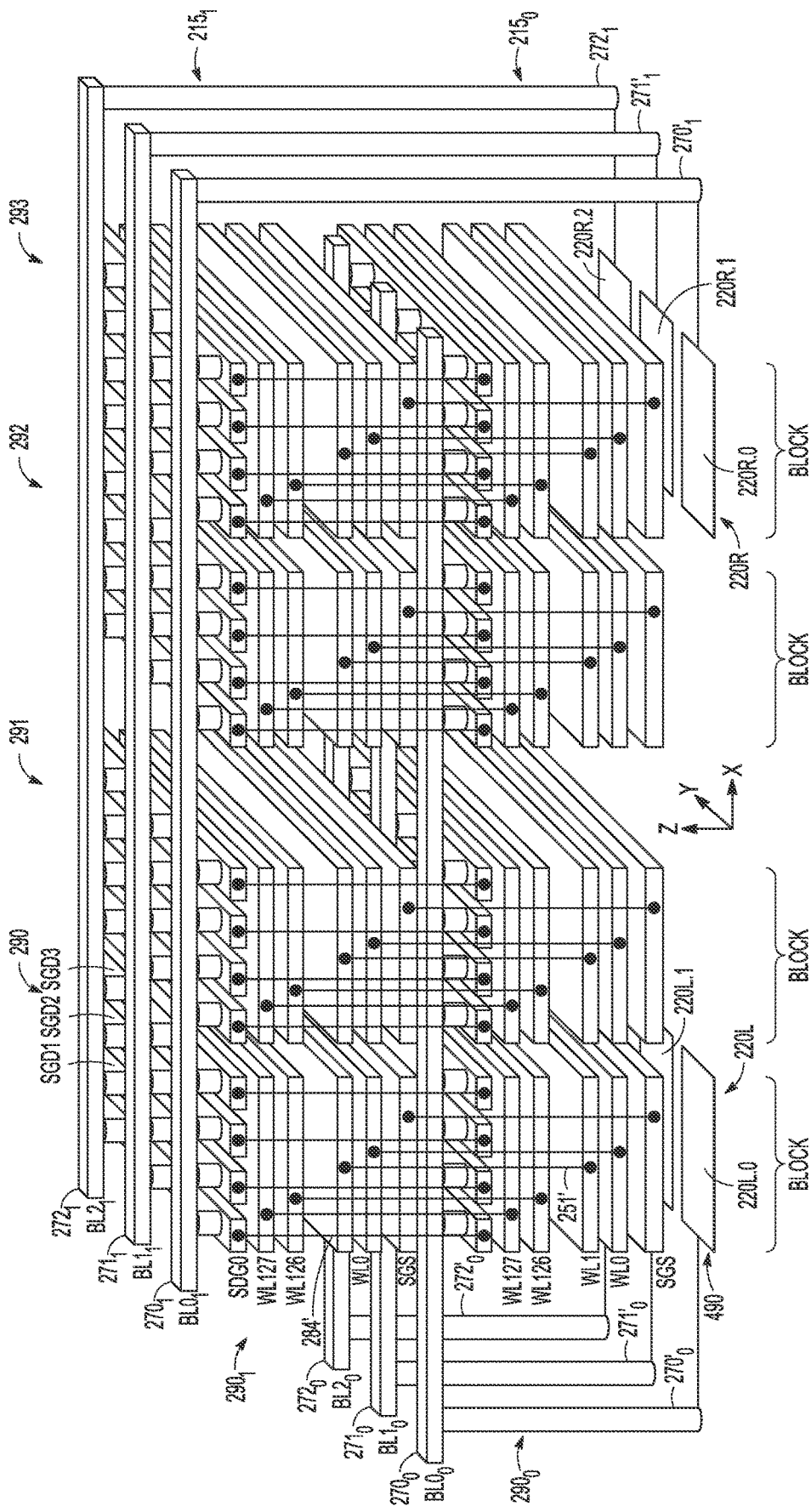
FIG. 4 shows a perspective view of a structure of the memory device of FIG. 2 including some of the memory cell blocks of the memory device, according to some embodiments described herein.

FIG. 4 shows a perspective view of a structure of memory device 200 of FIG. 2 including blocks (memory cell blocks) 290, 291, 292, and 293, according to some embodiments described herein. Memory device 200 can include numerous other blocks (e.g., 1048 blocks or a different number of blocks). As shown in FIG. 4, blocks 290 and 293 can be located at two respective edges (e.g., left and right edges opposite from each other in the X-direction) of each of decks $215_0$ and $215_1$. Other blocks (e.g., blocks 291 through 292) of memory device 200 can be located between blocks 290 and 293. For simplicity, FIG. 4 shows four blocks 290, 291, 292, and 293 of memory device 200.

Figure 6:
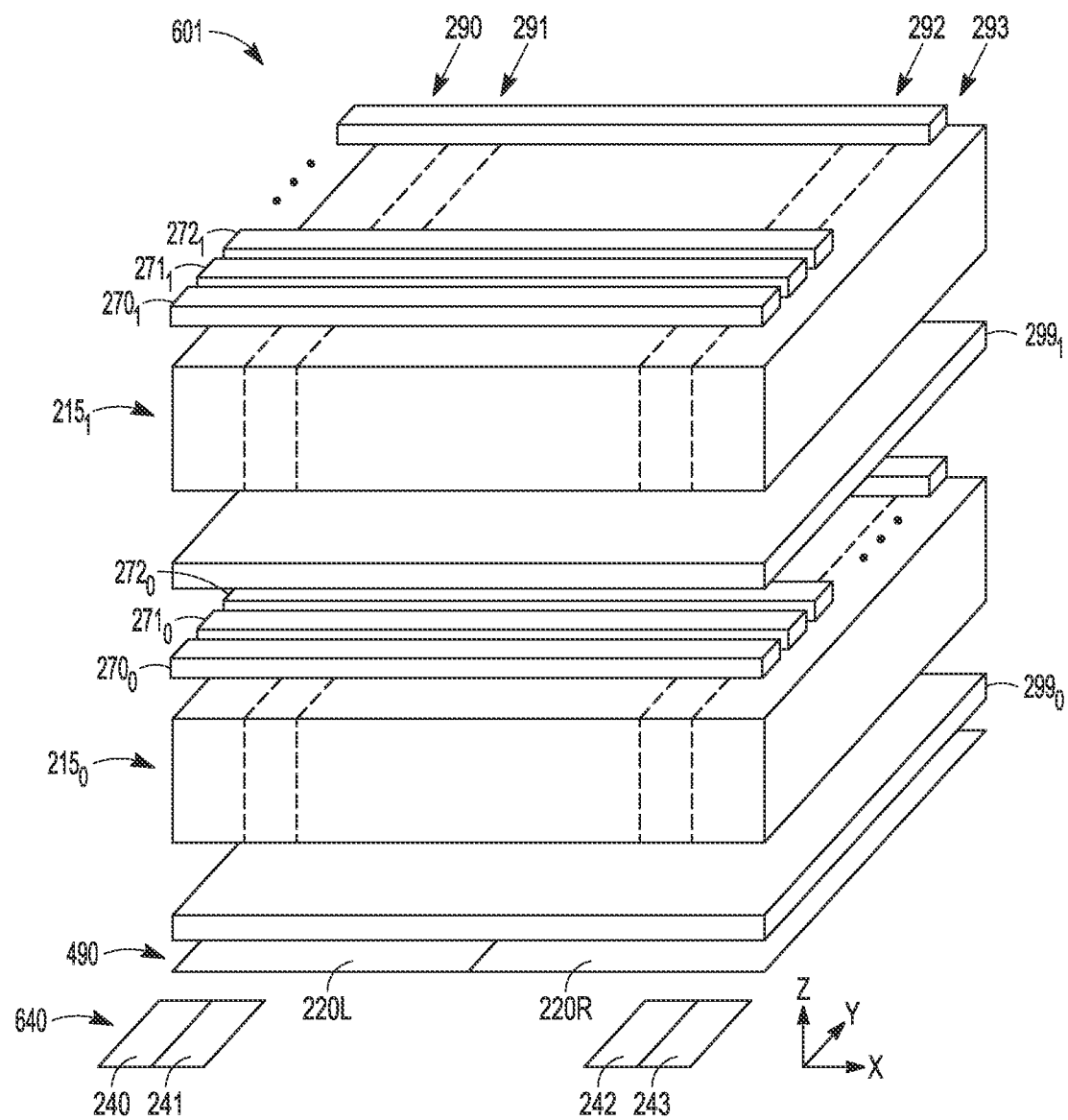
FIG. 6 shows another perspective view of the memory device of FIG. 2 through FIG. 6 including locations of driver circuits and page buffer circuits of the memory device, according to some embodiments described herein.

For simplicity, FIG. 4 omits driver circuit 240 and other driver circuits of memory device 200. FIG. 4 also omits line (e.g., source plate) $299_0$ of deck $215_0$ and line (e.g., source plate) $299_1$ of deck $215_1$. FIG. 6 (described below) shows an example location for the driver circuits and the source plates of memory device 200.

As shown in FIG. 4, memory device 200 can include a substrate 490 where buffer circuitries 220L and 220R can be located (e.g., formed in). Substrate 490 can include a monocrystalline (also referred to as single-crystal) semiconductor material (e.g., single-crystal silicon). The monocrystalline semiconductor material of substrate 490 can include impurities, such that substrate 490 can have a specific conductivity type (e.g., p-type). Buffer circuitries 220L and 220R can be located in opposite portions (e.g., left and right portions in the X-direction) of substrate 490. Buffer circuitries 220L.0, 220L.1, 220R.0, 220R.1, and 220R.2 are shown in FIG. 4. Buffer circuitry 220L.2 is hidden from the view of FIG. 4.

Deck $215_0$ can be formed over substrate 490 (e.g., over buffer circuitries 220L and 220R) of memory device 200. Deck $215_1$ can be formed over deck $215_0$. Each of blocks 290, 291, 292, and 293 can includes a portion of deck $215_0$ and a portion of deck $215_1$. For simplicity, FIG. 4 shows labels for only portions $290_0$ and $290_1$ of block 290.

For simplicity, detailed descriptions for the same elements of memory device 200 are given the same labels throughout the figures (FIG. 2 through FIG. 7) of the drawings and their description are not repeated. Some of the elements of memory device 200 may be shown in some of the figures of drawings and omitted from some other figures in the drawings. For example, FIG. 4 omits control gates associated with signals WL2 and WL3 in each of portions $290_0$ and $290_1$. The omitted control gates can be between the control gate associated with signal WL1 and the control gate associated with signal WL126. FIG. 4 shows control gates associated with signals WL126 and WL127 in each of portions $290_0$ and $290_1$ to indicate that each of portions $290_0$ and $290_1$ of block 290 can include 128 control gates (e.g., control gates $240_0$ through $240_{127}$, not labeled) associated with 128 corresponding signals (e.g., word line signals WL0, WL1 through WL126, and WL127). Similarly, in the example structure of memory device 200 of FIG. 4, each of blocks 291, 292, and 293 can include the same number of control gates as that of block 290 (e.g., control gates $240_0$ through $240_{127}$, not labeled, in each of the top and bottom portions of each of blocks 291, 292, and 293).

FIG. 4 shows the structure of memory device 200 including four drain select lines (associated with signals SGD0, SGD1, SGD2, and SGD3) in each of portions $290_0$ and $290_1$ of block 290 (and each of blocks 291, 292, and 293) as an example. However, the number of drain select lines in each of portions $290_0$ and $290_1$ of block 290 can vary. The drain select lines associated with signals SGD0, SGD1, and SGD2 are schematically shown in FIG. 2 and FIG. 3. The drain select line associated with signal (e.g., drain select line signal) SGD3 in FIG. 4 is not schematically shown in FIG. 2 and FIG. 3.

In FIG. 4, conductive lines (thin lines) extending in the Z-direction (between portions $290_0$ and $290_1$ of block 290) symbolically represent electrical connections (e.g., conductive lines) between two respective elements in each of blocks 290, 291, 292, and 293. Each of such electrical connections can include a structure of conductive material (or materials) that can include, e.g., metal, conductively doped polysilicon, or other conductive materials to provide an electrical conduction (e.g., a current path) between two elements connected by the electrical connection. For example, in FIG. 4, conductive line 284' can represent an electrical connection between two drain select lines 284 (not labeled) associated with signal SGD0 of respective portion $290_0$ and $290_1$. In another example, conductive line 251' can represent an electrical connection between two control gates $241_0$ and $241_1$ (not labeled) associated with signal WL1 of respective portions $290_0$ and $290_1$.

As shown in FIG. 4, each of control gates (not labeled) associated with signals WL0, WL1 through WL126, and WL127 can include a structure (e.g., a piece, a layer, or a level) of conductive material (e.g., metal, conductively doped polysilicon, or other conductive materials). Each of the source select lines (associated with signal SGS) can include a structure similar to that of each of the control gates. Each of the drain select lines (associated with signals SDG0, SGD1, SGD2, and SGD3) can include a structure (e.g., a piece, a layer, or a level) of conductive material (e.g., metal, conductively doped polysilicon, or other conductive materials) having a length extending in the Y-direction.

As shown in FIG. 4, data lines $270_0$, $271_0$, and $272_0$ can be located between decks $215_0$ and $215_1$. Each of data lines $270_0$, $271_0$, and $272_0$ can have a length extending in a direction (e.g., the X-direction) from one side (e.g., left side adjacent the left edge) of each of decks $215_0$ and $215_1$ to another side (e.g., right side adjacent the right edge) of each of decks $215_0$ and $215_1$. Data lines $270_0$, $271_0$, and $272_0$ can be coupled (e.g., directly coupled) to buffer circuits 220L.0, 220L.1, and 220L.2 through conductive paths $270'_0$, $271'_0$, and $272'_0$, respectively. Conductive paths $270'_0$, $271'_0$, and $272'_0$ can extend in a direction (e.g., Z-direction) perpendicular to substrate 490.

Data lines $270_1$, $271_1$, and $272_1$ can be located over decks $215_1$. Each of data lines $270_1$, $271_1$, and $272_1$ can have a length extending in the X-direction. Data lines $270_1$, $271_1$, and $272_1$ can be coupled (e.g., directly coupled) to buffer circuits 220R.0, 220R.1, and 220R.2 through conductive paths $270'_1$, $271'_1$, and $272'_1$, respectively. Conductive paths $270'_1$, $271'_1$, and $272'_1$ can extend in a direction (e.g., Z-direction) perpendicular to substrate 490.

As shown in FIG. 4, conductive paths $270'_0$, $271'_0$, and $272'_0$ can be located on a side (e.g., adjacent the left edge) of each of decks $215_0$ and $215_1$. Conductive paths $270'_1$, $271'_1$, and $272'_1$ can be, located on another side (e.g., right side opposite from the left side (e.g., adjacent the right edge) of each of decks $215_0$ and $215_1$ in the X-direction, which is perpendicular to the direction (e.g., Z-direction) from deck $215_0$ to deck $215_1$.

Conductive paths $270'_0$, $271'_0$, and $272'_0$ are physically separated from (e.g., electrically unconnected to) conductive paths $270'_1$, $271'_1$, and $272'_1$. Deck $215_0$ does not share conductive paths $270'_0$, $271'_0$, and $272'_0$ with deck $215_1$. Deck $215_1$ does not share conductive paths $270'_1$, $271'_1$, and $272'_1$ with deck $215_0$. This allows memory device 200 to concurrently access both portions (e.g., top and bottom portions) of a selected block (e.g., portions $290_0$ and $290_1$ of block 290) in the same operation. (e.g., the same read operation, the same write operation, or the same erase operation).

FIG. 4 shows example locations of buffer circuits 220L.0, 220L.1, and 220L.2 where at least a portion of each of buffer circuits 220L.0, 220L.1, and 220L.2 is under block 290 (e.g., located in a portion (e.g., left portion) of substrate 490 under block 290), and example locations of buffer circuits 220R.0, 220R.1, and 220R.2 where at least a portion of each of buffer circuits 220R.0, 220R.1, and 220R.2 is under block 293 (e.g., located in a portion (e.g., right portion) of substrate 490 under block 293). However, buffer circuits 220L.0, 220L.1, and 220L.2 and buffer circuits 220R.0, 2208.1, and 220R.2 can be located at different locations of substrate 490. In an alternative structure of memory device 200, some or all of buffer circuits 220L.0, 220L.1, and 220L.2 and buffer circuits 220R.0, 220R.1, and 220R.2 can be located at locations not under the memory cells (e.g., located outside the memory array) of memory device 200.

Figure 5:
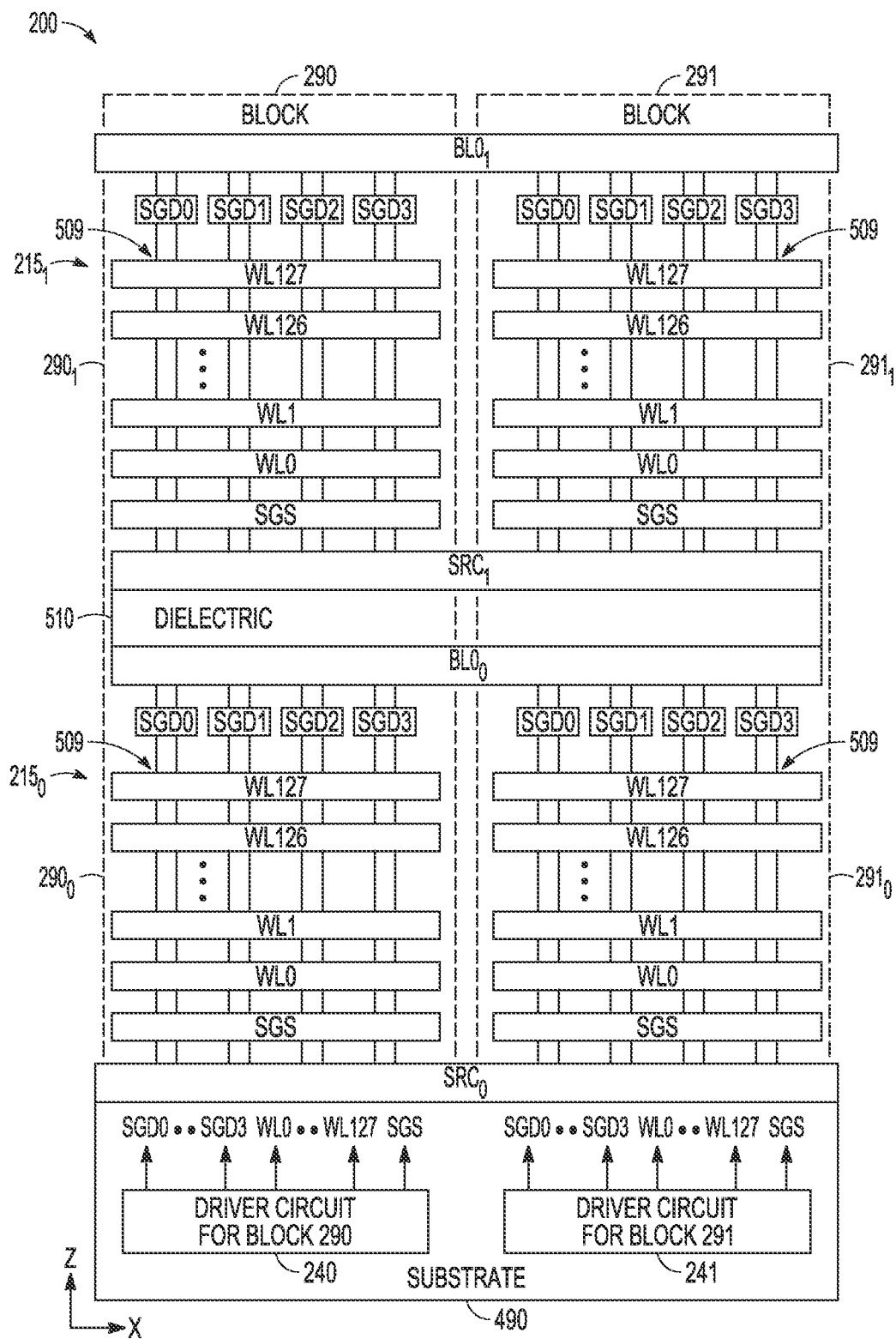
FIG. 5 shows a side view (e.g., cross-sectional view) of a portion of the memory device of FIG. 4 including two memory cell blocks of the memory device, according to some embodiments described herein.

FIG. 5 shows a side view (e.g., cross-sectional view) of a portion of memory device 200 including blocks 290 and 291, according to some embodiments described herein. The same elements of memory device 200 in FIG. 2 through FIG. 5 are given the same labels and detailed descriptions for the same elements of memory device 200 are not repeated.

As shown in FIG. 5, memory device 200 can include a dielectric structure (e.g., silicon dioxide) 510 between deck $215_0$ and deck $215_1$. Each of blocks 290 and 291 can include a portion (e.g., top portion) in deck $215_1$ and a portion (e.g., bottom portion) in deck $215_0$. For example, block 291 can include a portion (e.g., top portion) $291_1$ that is part of deck $215_1$ and a portion (e.g., bottom portion) $291_0$ that is part of deck $215_0$.

FIG. 5 omits electrical connections between the drain select lines (associated with signals SGD0, SGD1, SGD2, and SGD3) of portion $290_0$ of block 290 and the drain select lines (associated with signals SGD0, SGD1, SGD2, and SGD3) of portion $290_1$ of block 290. FIG. 5 also omits electrical connections between the drain select lines (associated with signals SGD0, SGD1, SGD2, and SGD3) of portion $291_0$ of block 291 and the drain select lines (associated with signals SGD0, SGD1, SGD2, and SGD3) of portion $291_1$ of block 291. The drain select lines (associated with signals SGD0, SGD1, SGD2, and SGD3 in block 290) of block 290 are electrically separated from the drain select lines (associated with signals SGD0, SGD1, SGD2, and SGD3 in block 291) of the other block.

As shown in FIG. 5, each of blocks 290 and 291 can have its own control gates, such that the control gates (associated with signals WL0, WL1 through WL126, and WL127) of block 290 can be electrically separated from the control gates (associated with signals WL0, WL1 through WL126, and WL127) of block 291.

As described above with reference to FIG. 2, memory device 200 can include a separate driver circuit for each block of memory device 200. FIG. 5 shows two driver circuits 240 and 241 associated with blocks 290 and 291, respectively. Driver circuits 240 and 241 can be located adjacent each other in the X-direction. For simplicity, FIG. 5 omits electrical connections between driver circuit 240 and other components of block 290, and electrical connections between driver circuit 241 and other components of block 291.

Each of driver circuits 240 and 241 can provide signals to a corresponding block. As shown in FIG. 5, driver circuit 240 can provide signals SGD0 through SGD3, WL0 through WL127, and SGS to block 290. Driver circuit 241 can provide signals SGD0 through SGD3, WL0 through WL127, and SGS to block 291. For simplicity, FIG. 5 shows the same labels for the signals in blocks 290 and 291. However, signals SGD0 through SGD3, WL0 through WL127, and SGS provided to block 290 (by driver circuit 240) are different from signals SGD0 through SGD3, WL0 through WL127, and SOS provided to block 291 (by driver circuit 241).

As shown in FIG. 5, each of blocks 290 and 291 can include pillars (e.g., pillars 509) extending in the Z-direction (e.g., a vertical body perpendicular to substrate 490). Only four pillars 509 are labeled in FIG. 5 to avoid crowding FIG. 5. As described in more detailed below with reference to FIG. 7, the memory cells of a memory cell string of memory device 200 can be located along the length (e.g., in the Z-direction) of a respective pillar among pillars 509.

FIG. 6 shows another perspective view including locations of driver circuits and page buffer circuits of memory device 200 of FIG. 2 through FIG. 5, according to some embodiments described herein. As shown in FIG. 6, decks $215_0$ and $215_1$ can be part of a memory array 601 of memory device 200. Thus, the blocks (only blocks 290, 291, 292, and 293 are labeled) of memory device 200 can be included in memory array 601.

As shown in FIG. 6, buffer circuitries 220L and 220R can be located on opposite sides (in the X-direction) of substrate 490. For example, buffer circuitry 220L can be located in a portion of substrate 490 of memory device 200 under (e.g., directly underneath) memory array 601 and on a side (e.g., left side) of memory array 601 (e.g., on the left side of each of decks $215_0$ and $215_1$). Buffer circuitry 220R can be located in another a portion of substrate 490 of memory device 200 under (e.g., directly underneath) memory array 601 and on another side (e.g., right side) of memory array 601 (e.g., on the right side of each of decks $215_0$ and $215_1$).

As shown in FIG. 6, memory device 200 can include driver circuitry 640 that can be located in a portion of substrate 490 adjacent (e.g., in the Y-direction and outside the footprint of) the portions of substrate 490 where buffer circuitries 220L and 220R are located. Driver circuitry 640 can include driver circuits 240 and 241 (described above with reference to FIG. 5). FIG. 6 also shows other driver circuits (e.g., driver circuits 242 and 243) of driver circuitry 640. As described above, each block among the blocks of memory device 200 can have its own driver circuit. In FIG. 6, for example, driver circuits 240, 241, 242, and 243 can be used to drive signals to the elements (e.g., control gates and select lines, not shown in detail) of blocks 290, 291, 292, and 293, respectively.

Figure 7:
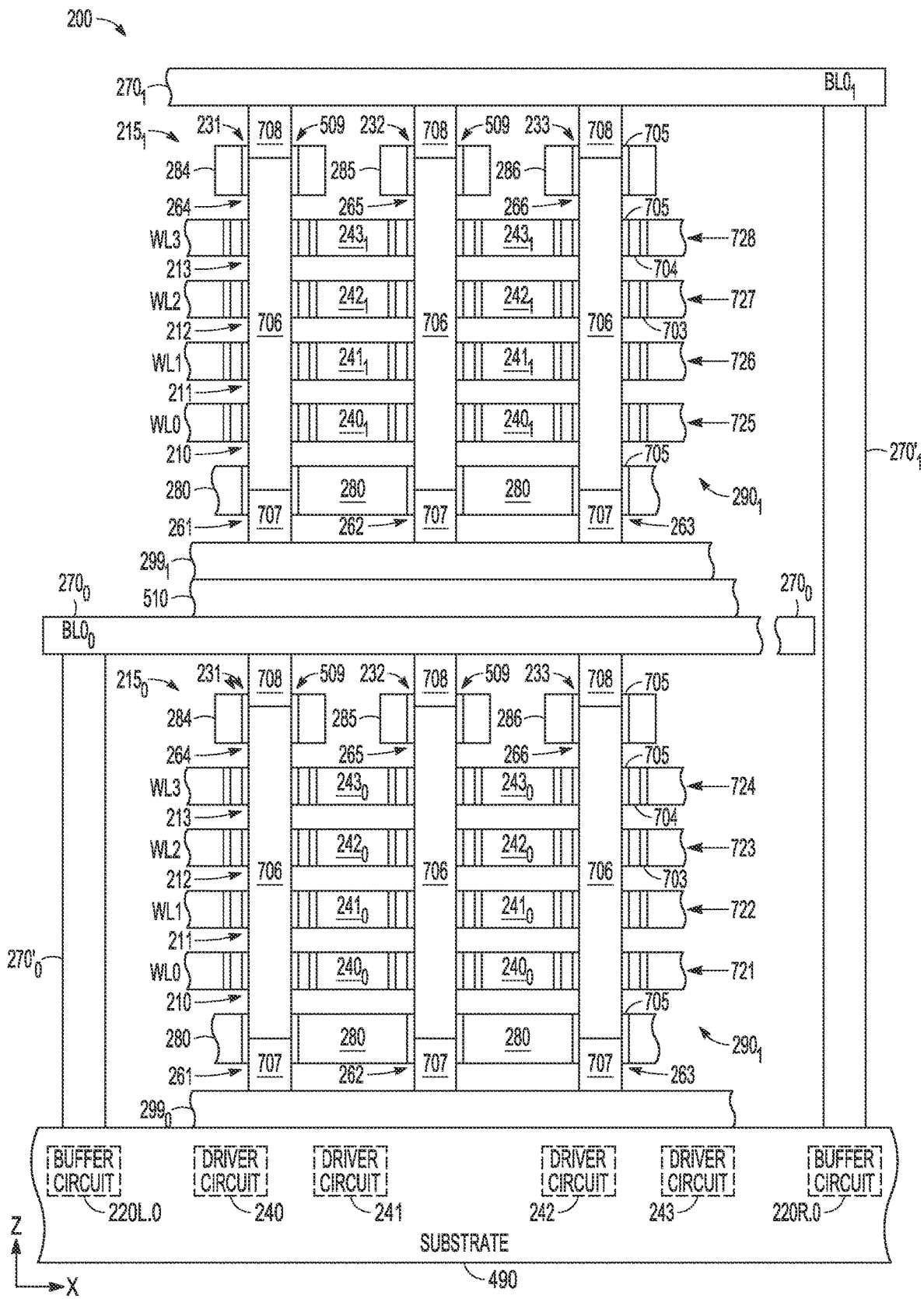
FIG. 7 shows a side view of a structure of a portion of the memory device of FIG. 2 through FIG. 6 including more details of pillars and of memory cells of a memory cell block of the memory device, according to some embodiments described herein.

FIG. 7 shows a side view of a structure of a portion of memory device 200 of FIG. 2 including more details of pillars 509 and of memory cells 210, 211, 212, and 213 of block 290, according to some embodiments described herein. Only four pillars 509 are labeled in FIG. 7 to avoid crowding FIG. 7. As shown in FIG. 7, decks $215_0$ and $215_1$ can be formed over substrate 490 (e.g., formed one over another (stacked) in the Z-direction over substrate 490).

As shown in FIG. 7, memory cells 210, 211, 212, and 213 of portion $290_0$ of block 290 can be located in different levels 721, 722, 723, and 724, respectively, of memory device 200 in the Z-direction. Memory cells 210, 211, 212, and 213 of portion $290_1$ of block 290 can be respectively located in different levels 725, 726, 727, and 728 of memory device 200 in the Z-direction.

Each of memory cell strings 231, 232, and 233 of each of portions $290_0$ or $290_1$ of block 290 can include at least part of a respective pillar among pillars 509. Pillar 509 can include pillar portions 706, 707, and 708 between a respective data line (data line $270_0$ or $270_1$) and a respective line (e.g., source line or source) $299_0$ or $299_1$. Pillar 509 can be configured to provide a conduction of current (e.g., to form a conductive structure (e.g., channel)) between the respective data line (data line $270_0$ or $270_1$) and a respective source (source $299_0$ or $299_1$). Pillar portions 706 and each of pillar portions 707 and 708 can include materials of different conductivity types. For example, pillar portion 706 can include a semiconductor material of p-type, and each of pillar portions 707 and 708 can include a semiconductor material of n-type. The semiconductor material can include polycrystalline silicon (polysilicon).

As shown in FIG. 7, control gates $240_0$, $241_0$, $242_0$, and $243_0$ in deck $215_0$ can be located along respective segments of pillar portion 706 of the pillar (one of pillars 509) of a respective memory cell string among memory cell strings 231, 232, and 233 of portion $290_0$ of block 290. Control gates $240_0$, $241_0$, $242_0$, and $243_0$ can be located in the Z-direction in the same levels (e.g., 721, 722, 723, and 724) where memory cells 210, 211, 212, and 213 of portion $290_0$ of block 290 are located.

Similarly, control gates $240_1$, $241_1$, $242_1$, and $243_1$ in deck $215_1$ can be located along respective segments of pillar portion 706 of the pillar (one of pillars 509) of a respective memory cell string among memory cell strings 231, 232, and 233 of portion $290_1$ of block 290. Control gates $240_1$, $241_1$, $242_1$, and $243_1$ can be located in the Z-direction in the same levels (e.g., 725, 726, 727, and 728) where memory cells 210, 211, 212, and 213 of portion $290_1$ of block 290 are located.

Each of decks $215_0$ and $215_1$ can include materials 703, 704, and 705 formed adjacent a respective pillar among pillars 509 of each of portion $290_0$ and $290_1$ of block 290. For simplicity, the following description focuses on materials 703, 704, and 705 in portion $290_0$ of block 290. Materials 703, 704, and 705 in portion $290_1$ of block 290 have similar structures and materials.

In portion $290_0$ of block 290, material 705 can be formed between a respective pillar among pillars 509 of a corresponding memory cell string (memory cell string 231, 232, or 233) and select line (e.g., source select line) 280. Material 705 can also be formed between a respective pillar among pillars 509 of a corresponding memory cell string (memory cell string 231, 232, or 233) and each of select lines (e.g., drain select lines) 284, 285, and 286. Material 705 can be used as a gate oxide for each of select transistors (e.g., source select transistors) 261, 262, and 263, and each of select transistors (e.g., drain select transistors) 264, 265, and 266.

The combination of materials 703, 704, 705 in portion $290_0$ of block 290 can be formed between pillar portion 706 of a corresponding pillar and each of control gates $240_0$, $241_0$, $242_0$, $243_0$. The combination of materials 703, 704, 705 can form part of the structure of a memory cell (e.g., memory cell 210, 211, 212, or 213) of portion $290_0$ of block 290. For example, the combination of materials 703, 704, and 705 can be part of a TANOS (TaN, $Al_2O_3$, $Si_3N_4$, $SiO_2$, Si) structure of each of memory cells 210, 211, 212, and 213 of each of portion $290_0$ and $290_1$ of block 290. In this example, material 703 (e.g., interpoly dielectrics) can include a charge-blocking material or materials (e.g., a dielectric material such as TaN and $Al_2O$) that is capable of blocking a tunneling of a charge. Material 704 can include a charge storage element (e.g., charge storage material or materials, such as $Si_3N_4$) that can provide a charge storage function trap charge) to represent a value of information stored in memory cells 210, 211, 212, or 213. Material 705 can include a tunnel dielectric material or materials (e.g., $SiO_2$) that is capable of allowing tunneling of a charge (e.g., electrons). As an example, material 705 can allow tunneling of electrons from pillar portion 706 to material 704 during a write operation and tunneling of electrons from material 704 to pillar portion 706 during an erase operation of memory device 200.

In another example, the combination of materials 703, 704, and 705 can be part of a SONOS (Si, $SiO_2$, $Si3N_4$, $SiO_2$, Si) structure of each of memory cells 210, 211, 212, and 213 of each of portion $290_0$ and $290_1$ of block 290. In a further example, the combination of materials 703, 704, and 705 can be part of a floating gate structure of each of memory cells 210, 211, 212, and 213 of each of portion $290_0$ and $290_1$ of block 290.

As shown in FIG. 7, buffer circuit 220L.0 (which is one of buffer circuits of buffer circuitry 220L) can be located in (e.g., formed in) a portion of (e.g., left portion) of substrate 490. Buffer circuit 220R.0 (which is one of buffer circuits of buffer circuitry 220R) can be located in (e.g., formed in) another portion of (e.g., right portion) of substrate 490. Thus, buffer circuitry 220L.0 and 220R.0 can be formed on opposite portions (e.g., left and right portions) in the X-direction of substrate 490.

As shown in FIG. 7, data line $270_0$ can have a length extending in a direction (e.g., the X-direction) from a portion of substrate 490 (e.g., the portion where buffer circuit 220L.0 is located) to another portion of substrate 490 (e.g., portion where buffer circuit 220R.0 is located). Similarly, data line $270_1$ can have a length extending in the direction. (e.g., X-direction) from the portion of substrate 490 where buffer circuit 220L.0 is located to the portion of substrate 490 where buffer circuit 220R.0 is located. Each of the other data lines (e.g., data lines $271_0$, $272_0$, $271_1$, and $272_1$ shown in FIG. 4) of memory device 200 can have a length extending in the direction (e.g., X-direction) from the portion of substrate 490 where buffer circuit 220L.0 is located to the portion of substrate 490 where buffer circuit 220R.0 is located.

As shown in FIG. 7, data line $270_0$ can be coupled (e.g., directly coupled) to buffer circuit 220L.0 through (e.g., directly through) conductive path $270'_0$. Conductive path $270'_0$ can be considered as part of data line $270_0$, such that the material of conductive path $270'_0$ can directly contact the material of data line $270_0$. Data line $270_1$ can be coupled (e.g., directly coupled) to buffer circuit 220R.0 through (e.g., directly through) a conductive path $270'_1$. Conductive path $270'_1$ can be considered as part of data line $270_1$, such that the material of conductive path $270'_1$ can directly contact the material of data line $270_1$. Each of conductive paths $270'_0$ and $270'_1$ can have a length extending in a direction (e.g., Z-direction) from deck $215_0$ to deck $215_1$ (e.g., extending vertically in the Z-direction). Each of conductive paths $270'_0$ and $270'$ can include a conductive material (or conductive materials) that is located (e.g., formed vertically) over substrate 490, such as conductively doped polycrystalline silicon, metal, or other conductive materials.

As shown in FIG. 7, conductive paths $270'_0$ and $270'_1$ are physically separated from each other (e.g., electrically unconnected to each other), and data lines $270_0$ and $270_1$ are separately coupled to buffer circuits 220 and 221 through conductive paths $270'_0$ and $270'_1$, respectively. Thus, conductive paths $270'_0$ and $270'_1$ are not shared by portions $290_0$ and $290_1$ of block 290. This allows memory device 200 to concurrently access both portions $290_0$ and $290_1$ of block 290 in the same operation (e.g., the same read operation, the same write operation, or the same erase operation), as described above with reference to FIG. 2 through FIG. 7.

The illustrations of apparatuses (e.g., memory devices 100 and 200) and methods (e.g., operating methods associated with memory devices 100 and 200 and methods (e.g., processes) of forming at least a portion of memory devices 100 and 200) are intended to provide a general understanding of the structure of various embodiments and are not intended to provide a complete description of all the elements and features of apparatuses that might make use of the structures described herein. An apparatus herein refers to, for example, either a device (e.g., any of memory devices 100 and 200) or a system (e.g., a computer, a cellular phone, or other electronic system) that includes a device such as any of memory devices 100 and 200.

Any of the components described above with reference to FIG. 1 through FIG. 7 can be implemented in a number of ways, including simulation via software. Thus, apparatuses (e.g., memory devices 100 and 200 or part of each of these memory devices, including a control unit in these memory devices, such as control unit 118 (FIG. 1)) described above may all be characterized as "modules" (or "module") herein. Such modules may include hardware circuitry, single and/or multi-processor circuits, memory circuits, software program modules and objects and/or firmware, and combinations thereof, as desired and/or as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

Memory devices 100 and 200 may be included in apparatuses (e.g., electronic circuitry) such as high-speed computers, communication and signal processing circuitry, single or multi-processor modules, single or multiple embedded processors, multicore processors, message information switches, and application-specific modules including multilayer, multichip modules. Such apparatuses may further be included as subcomponents within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 7 include apparatuses and methods of using the apparatuses. One of the apparatuses includes a substrate, a first deck including first memory cell strings located over the substrate, a second deck including second memory cell strings and located over the first deck, first data lines located between the first and second decks and coupled to the first memory cell strings, second data lines located over the second deck and coupled to the second memory cell strings, and first and second circuitries. The first and second data lines extending in a direction from a first portion of the substrate to a second portion of the substrate. The first buffer circuitry is located in the first portion of the substrate under the first memory cell strings of the first deck and coupled to the first data lines. The second buffer circuitry is located in the second portion of the substrate under the first memory cell strings of the first deck and coupled to the second data lines. Other embodiments including additional apparatuses and methods are described.

In the detailed description and the claims, the term "on" used with respect to two or more elements (e.g., materials), e.g., one "on" the other, means at least some contact between the elements (e.g., between the materials). The term "over" means the elements (e.g., materials) are in close proximity, but possibly with one or more additional intervening elements (e.g., materials) such that contact is possible but not required. Neither "on" nor "over" implies any directionality as used herein unless stated as such.

In the detailed description and the claims, a list of items joined by the term "at least one of" can mean any combination of the listed items. For example, if items A and B are listed, then the phrase "at least one of A and B" means A only; B only; or A and B. In another example, if items A, B, and C are listed, then the phrase "at least one of A, B and C" means A only; B only; C only; A and B (excluding C); A and C (excluding B); B and C (excluding A); or all of A, B, and C. Item A can include a single element or multiple elements. Item B can include a single element or multiple elements. Item C can include a single element or multiple elements.

In the detailed description and the claims, a list of items joined by the term "one of" can mean only one of the list items. For example, if items A and B are listed, then the phrase "one of A and B" means A only (excluding B), or B only (excluding A). In another example, if items A, B, and C are listed, then the phrase "one of A, B and C" means A only; B only; or C only, Item A can include a single element or multiple elements. Item B can include a single element or multiple elements. Item C can include a single element or multiple elements. In the detailed description and the claims, a list of items joined by the term "at least one of" can mean any combination of the listed items. For example, if items A and B are listed, then the phrase "at least one of A and B" can mean A only; B only; or A and B. In another example, if items A, B, and C are listed, then the phrase "at least one of A, B and C" can mean A only; B only; C only; A and B (without C); A and C (without B); B and C (without A); or A, B, and C. Each of items A, B, and C can include a single element (e.g., a circuit element) or a plurality of elements (e.g., circuit elements).

The above description and the drawings illustrate some embodiments of the invention to enable those skilled in the art to practice the embodiments of the invention. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. An apparatus comprising:
   a substrate;
   a first deck located over the substrate, the first deck including first memory cell strings;
   a second deck located over the first deck, the second deck including second memory cell strings;
   first data lines located between the first and second decks and coupled to the first memory cell strings, the first data lines include a first data line and a second data line;
   second data lines located over the second deck and coupled to the second memory cell strings, the second data lines electrically separated from the first data lines, the first and second data lines extending in a first direction from a first portion of the substrate to a second portion of the substrate, the second data lines include a third data line and a fourth data line;
   a first memory block including a first portion located in the first deck and a second portion located in the second deck, the first portion of the first memory cell block including a first portion of the first memory cell strings, the second portion of the first memory cell block including a first portion of the second memory cell strings;
   a second memory block including a first portion located in the first deck and a second portion located in the second deck, the first portion of the second memory cell block including a second portion of the first memory cell strings, the second portion of the second memory cell block including a second of the second memory cell strings;
   the first portion of the first memory cell block sharing the first data line and the second data line with the first portion the second memory block;
   the second portion of the first memory cell block sharing the third data line and the fourth data line with the second portion the second memory block, wherein the first memory cell block is coupled to first access lines, the second memory cell block is coupled to second access lines, and the first access lines are separated from the second access lines;
   a direction from the first memory cell block to the second memory block being the first direction from the first portion of the substrate to the second portion of the substrate;
   first buffer circuitry located in the first portion of the substrate under the first memory cell strings of the first deck and coupled to the first data lines, wherein the first buffer circuitry includes:
   a first buffer circuit coupled to the first data line;
   a second buffer circuit coupled to the second data line, and a direction from the first buffer circuit to the second buffer circuit is a second direction perpendicular to the first direction; and
   second buffer circuitry located in the second portion of the substrate under the first memory cell strings of the first deck and coupled to the second data lines, wherein the second buffer circuitry includes:
   a third buffer circuit coupled to the third data line;
   a fourth buffer circuit coupled to the fourth data line, and a direction from the third buffer circuit to the fourth buffer circuit is the second direction; and
   driver circuits coupled to the first memory cell strings and the second memory cell strings, the driver circuits located in a third portion of the substrate adjacent each of the first and second portions of the substrate, wherein a direction from the driver circuits to the first and second buffer circuits is perpendicular to the first direction.

2. The apparatus of claim 1, further comprising:
   first conductive paths, each of the first conductive paths coupled to a respective data line of the first data lines, the first conductive paths extending in a direction perpendicular to the substrate, wherein the first buffer circuitry is coupled to the first data lines through the first conductive paths; and
   second conductive paths, each of the second conductive paths coupled to a respective data line of the second data lines, the second conductive paths extending in the direction perpendicular to the substrate, wherein the second buffer circuitry is coupled to the second data lines through the second conductive paths.

3. The apparatus of claim 2, wherein the first conductive paths are located on a first side of the first deck, and the second conductive paths are located on a second side opposite from the first side of the first deck.

4. The apparatus of claim 1, wherein the first access lines are coupled to the first portion of the first memory cell strings and the portion of the second memory cell strings, and the second access lines are coupled to the second portion of the first memory cell strings and the second of the second memory cell strings.

5. An apparatus comprising:
   a substrate;
   a first portion of a first memory cell block including first memory cell strings located over the substrate;
   a second portion of the first memory cell block located over the first portion of first memory cell block, the second portion of the first memory cell block including second memory cell strings;

first data lines located between the first and second portions of the first memory cell block;

first select transistors, each of the first select transistors located between a respective data line of the first data lines and a respective memory cell string of the first memory cell strings, the first select transistors including a first select transistor, and a second select transistor;

second data lines located over the second portion of the first memory cell block;

second select transistors, each of the second select transistors located between a respective data line of the second data lines and a respective memory cell string of the second memory cell strings, the second select transistors including a first additional select transistor, a second additional select transistor;

select lines, each of the select lines coupled to a respective select transistor of the first select transistors and a respective select transistor of the second select transistors, the select lines including a first select line and a second select line, wherein the first select line is directly coupled to the first select transistor and the first additional select transistor, and the second select line is directly coupled to the second select transistor and the second additional select transistor;

a first portion of a second memory cell block including first additional memory cell strings located over the substrate, the first portion of the second memory cell block sharing the first data lines with the first portion of the first memory cell block;

a second portion of the second memory cell block located over the first portion of the second memory cell block, the second portion of the second memory cell block including second additional memory cell strings, the second portion of the second memory cell block sharing the second data lines with the second portion of the first memory cell block, wherein the first memory cell block is coupled to first access lines, the second memory cell block is coupled to second access lines, and the first access lines are separated from the second access lines;

first additional select transistors, each of the first additional select transistors located between a respective data line of the first data lines and a respective memory cell string of the first additional memory cell strings;

second additional select transistors, each of the second additional transistors located between a respective data line of the second data lines and a respective memory cell string of the second additional memory cell strings;

additional select lines, each of the additional select lines coupled to a respective select transistor of the first additional select transistors and a respective select transistor of the second additional select transistors, wherein the first data lines are also located between the first and second portions of the second memory cell block, and the second data lines are also located over the second portion of the second memory cell block;

first buffer circuits, each of the first buffer circuits coupled to a respective data line of the first data lines, wherein a direction from one buffer circuit to another buffer circuit of the first buffer circuits is perpendicular to a direction of lengths of the first data lines;

second buffer circuits, each of the second buffer circuits coupled to a respective data line of the second data lines, wherein a direction from one buffer circuit to another buffer circuit of the second buffer circuits is perpendicular to a direction of lengths of the second data lines.

6. The apparatus of claim 5, wherein the first access lines are shared by the first and second portions of the first memory cell block, and the second access lines are shared by the first and second portions of the second memory cell block wherein the first access lines are coupled to the first portion of the first memory cell strings and the portion of the second memory cell strings, and the second access lines are coupled to the second portion of the first memory cell strings and the second of the second memory cell strings.

7. The apparatus of claim 5, further comprising:
a first driver circuit coupled to the first and second portions of the first memory cell block; and
a second driver circuit coupled to the first and second portions of the second memory cell block.

8. The apparatus of claim 7, wherein:
the first access lines are shared by the first and second portions of the first memory cell block; and
the second access lines are shared by the first and second portions of the second memory cell block.

9. An apparatus comprising:
a substrate;
a first deck located over the substrate, the first deck including first memory cell strings;
a second deck located over the first deck, the second deck including second memory cell strings;
first data lines located between the first and second decks and coupled to the first memory cell strings;
second data lines located over the second deck and coupled to the second memory cell strings, the first and second data lines extending in a direction from a first side of the first deck to a second side of the first deck;
memory cell blocks, each of the memory cell blocks including a first portion and a second portion, the first portion including a respective portion of the first memory cell strings, the second portion including a respective portion of the second memory cell strings, the memory cell blocks including a first memory block and a second memory cell block, wherein the first memory cell block is coupled to first access lines, the second memory cell block is coupled to second access lines, and the first access lines are separated from the second access lines;
the first portion a memory cell block of the memory cell blocks sharing the first data lines with the first portion of another memory cell block of the memory cell blocks;
the second portion a memory cell block of the memory cell blocks sharing the second data lines with the second portion of another memory cell block of the memory cell blocks;
first conductive paths located on the first side of the first deck and coupled to the first data lines, the first conductive paths extending in a direction perpendicular the substrate;
first buffer circuitry including first buffer circuits located in a first portion of the substrate and coupled to the first conductive path, wherein a direction from one buffer circuit to another buffer circuit of the first buffer circuits is perpendicular to a direction of lengths of the first data lines;
second conductive paths located on the second side of the first deck and coupled to the second data lines, the second conductive paths extending in the direction perpendicular the substrate;

second buffer circuitry including second buffer circuits located in a second portion of the substrate and coupled to the second conductive paths, wherein a direction from one buffer circuit to another buffer circuit of the second buffer circuits is perpendicular to a direction of lengths of the second data lines; and driver circuits located in a third portion of the substrate adjacent each of the first and second portions of the substrate, each of the driver circuits coupled to a respective memory cell block of the memory cell blocks, wherein a direction from the driver circuits to the first buffer circuitry is perpendicular to the direction from the first side of the first deck to the second side of the first deck.

10. The apparatus of claim 9, wherein:
the first access lines are shared by the first and second portions of the first memory cell block; and
the second access lines are shared by the first and second portions of the second memory cell block.

11. The apparatus of claim 9, wherein the first and second portions of the substrate are under the first deck.

12. The apparatus of claim 9, wherein a number of the first data lines is equal to a number of the second data lines.

13. A method of operating a memory device, the method comprising:
accessing first memory cells of first memory cell strings of a first portion of a memory cell block of the memory device during a memory operation of the memory device, the first portion of the memory cell block located over a substrate of the memory device;
accessing second memory cells of second memory cell strings of a second portion of the memory cell block during the memory operation, the second portion of the memory cell block located over the first portion of the memory cell block;
turning on first select transistors coupled between the first memory cell strings and first data lines during the memory operation, the first data lines located over the first portion of the memory cell block;
turning on second select transistors coupled between the second memory cell strings and second data lines during the memory operation, the second data lines located over the second portion of the memory cell block, and each of the first select transistors coupled to a respective select transistor of the second select transistors;
passing first information from first buffer circuits coupled to the first data lines to input/output circuitry, the first buffer circuits located in a first portion of the substrate, wherein the first information represents information read from the first memory cells during the memory operation; and
passing second information from second buffer circuits coupled to the second data lines to the input/output circuitry, the second buffer circuits located in a second portion of the substrate, wherein the second information represents information read from the second memory cells during the memory operation, and wherein bits of the first information and bits of the second information are alternately passed to the input/output circuitry.

14. The method of claim 13, wherein the bits of the second information are passed to the input/output circuitry after the bits of the first information are passed to the input/output circuitry.

15. The method of claim 13, wherein the bits of the first information are passed to the input/output circuitry after the bits of the second information are passed to the input/output circuitry.

* * * * *